United States Patent [19]
Khater et al.

[11] Patent Number: 6,023,173
[45] Date of Patent: Feb. 8, 2000

[54] MANIPULATOR WITH EXPANDED RANGE OF MOTION

[75] Inventors: Nabil Khater, San Jose, Calif.; David A. Baker, Hillsboro, Oreg.

[73] Assignee: Credence Systems Corporation, Fremont, Calif.

[21] Appl. No.: 08/846,691

[22] Filed: Apr. 30, 1997

[51] Int. Cl.[7] .................................................. G01R 31/02
[52] U.S. Cl. ........................ 324/758; 324/754; 414/590
[58] Field of Search ................................... 324/754, 758, 324/158.1; 414/590, 673, 744.1, 744.2, 744.3, 744.4, 744.6, 744.7

[56] References Cited

U.S. PATENT DOCUMENTS

| | | | |
|---|---|---|---|
| 4,527,942 | 7/1985 | Smith | 414/590 |
| 4,589,815 | 5/1986 | Smith | 414/590 |
| 4,705,447 | 11/1987 | Smith | 414/590 |
| 4,973,015 | 11/1990 | Beaucoup et al. | 248/124.2 |
| 5,598,104 | 1/1997 | Boyette, Jr. | 324/754 |
| 5,606,262 | 2/1997 | Montalbano et al. | 324/758 |

*Primary Examiner*—Josie Ballato
*Assistant Examiner*—Russell M. Kobert
*Attorney, Agent, or Firm*—Smith-Hill and Bedell

[57] ABSTRACT

A manipulator with an expanded range of motion. The manipulator attaches to a testing head for manipulation of the testing head for testing semiconductor devices. A vertical bearing assembly is coupled to a horizontal bearing assembly so as to give vertical and horizontal motion. An expansion joint attaches to the horizontal bearing assembly such that the length of the manipulator may be expanded and retracted. A swing arm attaches to the expansion joint such that it may rotate horizontally. A tumble assembly couples a rotary bearing assembly to the swing arm. The test head attaches to the rotary bearing assembly such that the rotation of the tumble assembly gives tumble rotation and such that the rotation of the rotary bearing assembly gives twist rotation. By rotating the swing arm, tumble rotation may be obtained by rotating the rotary bearing assembly and twist rotation may be obtained by movement of the tumble assembly. The component systems work together to give smooth motion and easy control of the head such that testing may be accomplished for DUT up, DUT down, DUT side and DUT forward using the same tester.

20 Claims, 19 Drawing Sheets

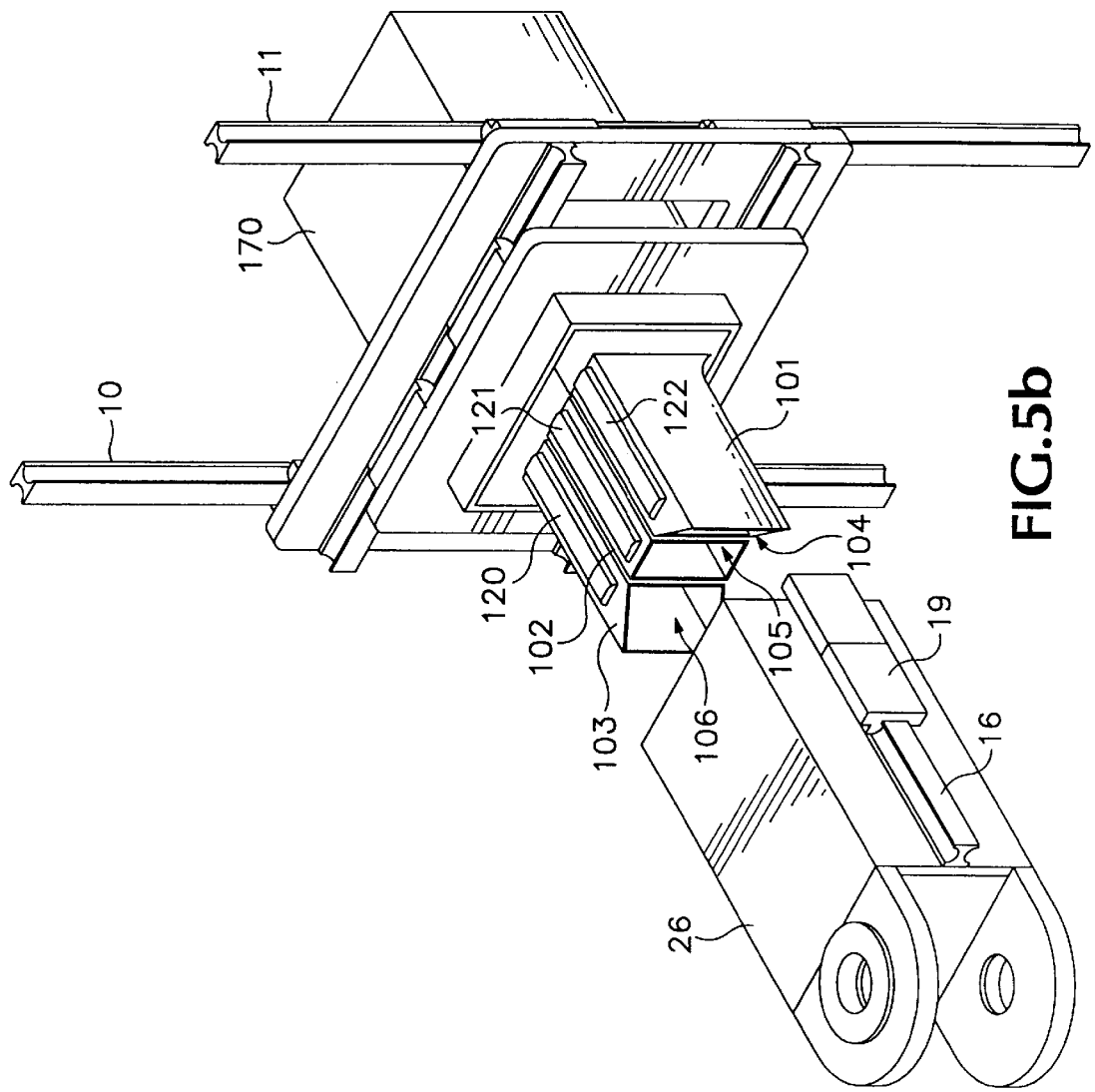

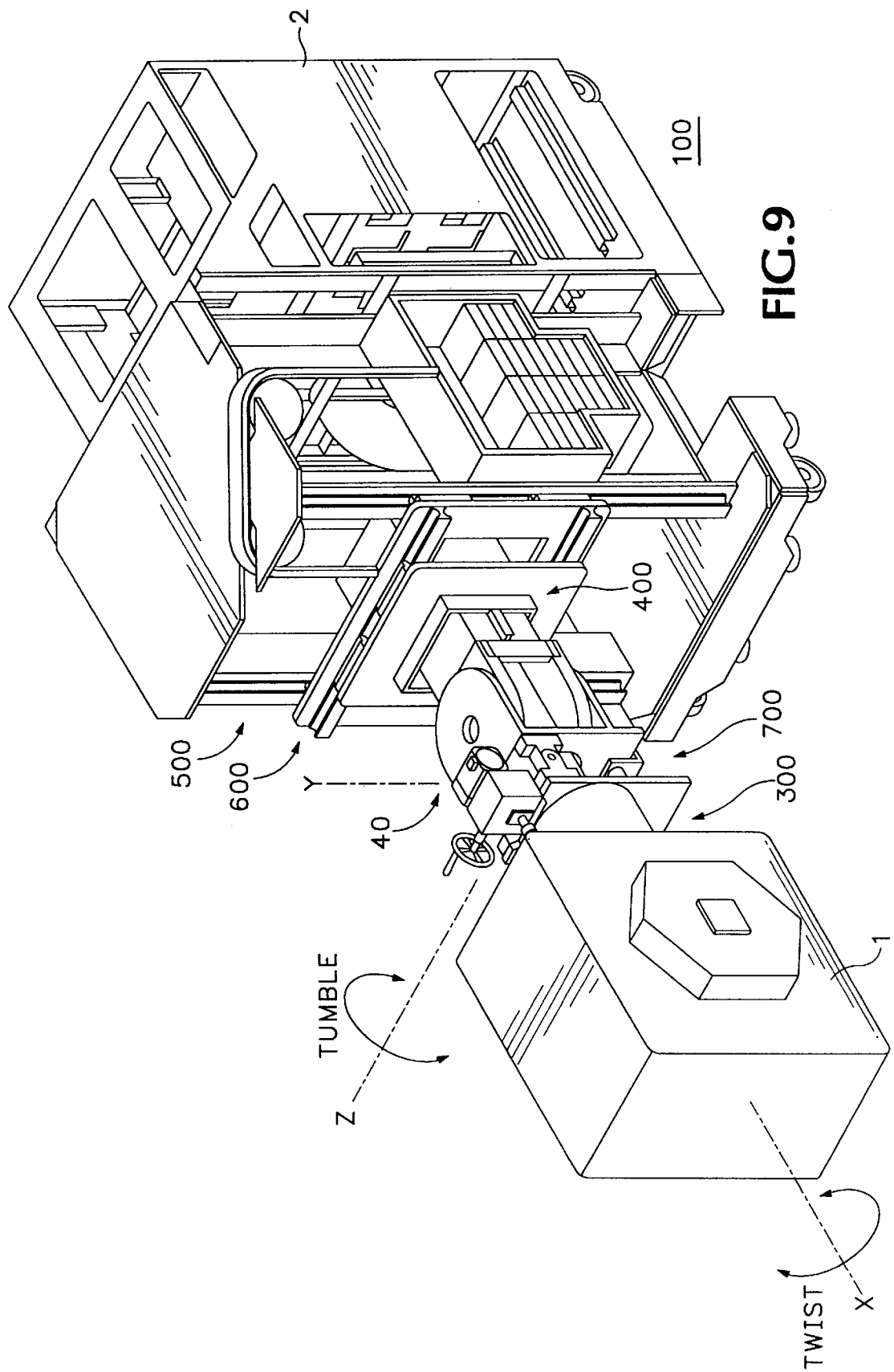

MANIPULATOR WITH EXPANDED RANGE OF MOTION

TECHNICAL FIELD

The present claimed invention relates to the field of testing devices for electronic components. More specifically, the present invention relates to a manipulator for positioning a testing head for testing of electronic components.

BACKGROUND ART

Prior art systems for testing electronic devices, and in particular, for testing semiconductor devices typically include electronic circuits, a frame, and a manipulator assembly which attaches to a testing head. The electronic circuits for testing are located in the test head itself. However, some electronic circuits for processing and recording the testing may be located within the frame or within a separate computer. A cable assembly consisting of multiple cables is used to provide power to the electronic circuits of the test head and to connect the electronic circuits in the test head to utilities such as power sources and to other devices. Since the testing process requires a large amount of power, large, heavy power cables are required to transfer the power from the power source to the test head. Testing units that do pressure testing include cables that couple high pressure gas from a source to the test head. In addition, due to the heat generated by the complex processing circuitry in the test head, the test head must be cooled. One way to cool the electronic components in the test head is to circulate cooling fluids through the test head. In testing devices that circulate cooling fluids, cables conduct the cooling fluid from a heat exchanger to the test head and return the spent cooling fluid to the heat exchanger. In prior art systems, the cable is commonly left lying on the ground or held up by slings as it extends from the manipulator assembly to the processing circuitry.

Prior art manipulator assemblies use yokes which attach to opposite sides of a testing head for producing tumble motion in the test head. Though these prior art manipulator assemblies do allow for some motion, the range of motion is quite limited. In addition, the yoke gets in the way, obstructing the operators access to the testing surface and limiting the movement of the test head itself.

More recent manipulator assemblies typically allow for horizontal motion by attaching an arm to a vertical rail. The arm attaches to the testing head using a yoke that attaches to opposite sides of the testing head. The yoke must be large enough to allow the testing head to fit within the interior of the yoke and it must be strong enough to support the heavy weight of the testing head. Consequently, designs that use yokes are bulky due to the large diameter of the yoke and the large size of the yoke.

Prior art testers take up a significant amount of room on the assembly room floor. In addition, due to the heavy weight of testing devices, the devices are difficult to move. Based on the layout of the assembly room and the equipment used in the assembly and handling processes, prior art systems have been designed to fit within specific locations and to perform testing within narrowly defined criteria. Thus, testers are generally custom designed to fit the needs of particular users.

As products have rapidly matured and assembly and handling equipment has been updated, the narrow range of movement and lack of flexibility of prior art designs has prevented many designs from fitting into the workspace area allocated for testing equipment. In addition, as assembly methods and wafer handling methods have become more automated and sophisticated, users are requiring different criteria and ranges of motion. Moreover, the test head must interface with a large loader. There are many different loader manufacturers and a variety of different loader designs. Therefore, the test head must be moved into various positions to accommodate the particular design of each loader used in the manufacturing process. Typically, prior art manufacturers have simply added new models which meet each new criteria or they modify existing designs to accommodate the needs of a particular customer. This process is time consuming and expensive. In addition, it results in a testing device which may need to be modified whenever a user purchases different handling equipment or changes the assembly room layout.

Space on the assembly room floor is limited and expensive. Testing devices compete for space with other devices such as handlers and probers which must be used in close proximity to the tester. Therefore, footprint and versatility of use for testing devices is critical.

More recent designs have increased the versatility of the tester's design by allowing for vertical motion of the manipulator. These prior art testers include manipulator assemblies that have a vertical rail system for positioning the manipulator. The vertical rail is typically a short round rail around which a horseshoe shaped attachment fitting resides. The attachment fitting is typically attached to an arm which is attached to one end of the yoke. The testing head is then attached to the yoke. A locking screw allows the arm to be moved up and down along the length of the vertical rail until the testing head is properly positioned and then engaged so as to lock the testing head into the proper position. However, the range of vertical motion is typically limited to 26 to 28 inches of vertical motion. Thus, these types of prior art testers, though they are more versatile than other prior art designs, still only offer a narrow range of improvement.

Other recent design improvements have included the use of pivots that are placed between the portion of the arm that attaches to the frame and the yoke so as to allow for the movement of the yoke within a radial arc around the pivot point. Though this type of design allows for more versatility it still does not accommodate the needs of many loader designs and different assembly room layouts. In particular, some loaders require testing with the test head forward which is typically referred to as device under testing (DUT) forward. Other loaders require testing in the DUT up position (where the device to be tested is placed over the test head) and the DUT down position (where the device to be tested is placed below the test head). For these applications, though prior art manipulators may pivot, they still must be specifically designed for each required testing position as dictated by the loader used and the layout of the testing area.

Yet another recent improvement has been the incorporation of "twist" motion into the manipulator design. Prior art designs which allow for "twist" incorporate rotary bearings between the connection to the pole and the arm. By rotating the bearings, the arm, the pivot, the yoke and the test head rotate. This design allows DUT up, DUT down and DUT forward testing to be performed by the same testing unit without the need to reconfigure the testing device itself. However, the heavy cables make movement difficult and limit the range of movement. In addition, the cables prevent the tester from being moved into various positions as they interfere with pivoting, rotation and tumble movement. Moreover, prior art designs using yokes have little or no tumble motion. This is because the yoke design, in combination with the heavy cables, allows only a limited amount of movement of the test head within the yoke. Typically, movement of the test head within the yoke is only plus or minus two and a half inches along the outer edges of the test head.

Since the length of the manipulator is fixed only motion within a fixed arc is possible. Thus, though prior art designs allow for twist, pivot, up, down and minimal tumble motion, the range of motion is limited to a fixed arc. Only those testers that allow for horizontal motion provide for movement outside of a single horizontal arc. However, since horizontal motion of prior art manipulators is typically only eight inches or less, the range of movement provided by manipulators with horizontal motion is still quite limited.

The yoke, the arm, the cable and the test head are relatively heavy. The weight of these components causes the arm on prior art designs to deflect. This deflection is commonly referred to as sag. This sag causes misalignment at the testing head that often cannot be corrected by the up and down motion, pivot motion, twist motion or even the limited tumble motion of prior art manipulators. The limited tumble motion allowed by prior art tester designs can correct for sag when the amount of sag is small enough to be corrected by the limited tumble movement allowed by the yoke design. However, sag correction using the limited tumble motion of the yoke is only possible for a few testing positions and correction is dependent on the orientation of the yoke. Some test heads allow for rotation of the testing surface with respect to the test head. However, this motion is limited (usually no greater than a total movement of 3 degrees). In some cases, this correction is not sufficient to overcome the deflection of the arm. In addition, since the movement of the electronics within the test head moves the electronics package out of the locked position. When the electronics package is moved out of the locked position, the electronics package may rotate within the test head. This freedom of movement of the electronics package within the test head may cause damage to the delicate electronics located within the electronics package due to motion, vibration and shock to the test head. Therefore, movement of the testing surface is not a good solution to the problem of sag correction.

Accordingly, what is needed is a tester design which includes a manipulator that has a limited footprint and which will allow for a full range of movement of the test head. More specifically, a manipulator which is not restricted to movement within a radial arc is needed. Furthermore, a tester design which will allow for the compensation of sag is needed. In addition, a tester design which will allow for full "tumble" movement is needed. Moreover, a design which will allow for smooth and easy adjustment and positioning of the test head is required. The present invention provides such solutions to the above needs.

DISCLOSURE OF THE INVENTION

The present invention meets the above needs with a tester that provides for a full range of motion. The manipulator includes a frame mounted horizontal rail assembly and a vertical rail assembly that allow for a wide range of horizontal and vertical motion. The present invention includes a swing arm which rotates through a wide range of swing motion and a rotary bearing assembly which provides a wide range of twist motion. The manipulator also includes an expansion joint that allow for the extension of the swing arm out from the frame. In addition to up and down motion, rotary motion and twist, the present invention allows for plus or minus ninety degrees of tumble motion. Furthermore, the present invention allows for compensation of sag for all testing positions.

A tester that includes a manipulator that allows for a full range of motion is described. The manipulator includes a horizontal rail assembly that includes rails that are longer than prior art horizontal rails. This allows for a wider range of horizontal movement. The manipulator also includes a vertical rail assembly that includes rails that are longer than prior art vertical rails. This allows for a wider range of vertical movement. The horizontal rail assembly is coupled to the vertical rail assembly to allow for smooth movement both horizontally and vertically. A plate is attached to the horizontal rail assembly. An expansion joint is coupled to the plate and is coupled to the swing arm so as to allow the length of the manipulator to be varied. The expansion joint includes a longitudinal rail assembly that includes a rail which extends longitudinally. Bearings which are attached to the swing arm allow the swing arm to move in and out laterally so as to expand and retract the distance from the swing arm to the frame.

The swing arm is attached to the expansion joint by pivot pins that engage openings in the expansion joint and in the swing arm. The swing arm pivots or "swings" about an axis running through the center of the pivot pins. The swing arm is attached to a rotary bearing assembly which is attached to the test head. The swing arm is attached to the rotary bearing assembly by a second set of pivot pins that allow the rotary bearing to rotate with respect to an axis running transverse to the axis of the swing arm. The motion about this transverse axis is referred to as tumble motion. A screw which is coupled to the rotary bearing assembly engages a gear box attached to the swing arm so as to control the amount of tumble motion.

Twist rotation is provided by a rotary bearing assembly which includes two rotating cylindrical flanges and bearings that are disposed between the flanges so as to allow the flanges to easily rotate. One flange is coupled to the swing arm and the other flange is coupled to the test head such that the test head may rotate about yet another axis within a range of plus or minus ninety degrees with respect to the swing arm so as to provide twist rotation.

The freedom of movement of the present invention allows for expanded motion with respect to horizontal, vertical, twist and tumble motion. The motion provided by the present invention may also be described with reference to a standard x-y-z coordinate system. In such a coordinate system, twist rotation would constitute rotation about the x axis when the arm is rotated with 0 degrees of swing and expansion and contraction of the expansion joint would constitute movement along the x axis. In this coordinate system, rotation of the tumble assembly when the arm is rotated with 0 degrees of swing constitutes rotation about the z axis while motion along the horizontal rail assembly constitutes movement along the z axis. Rotation of the swing arm constitutes movement along the x axis and along the z axis and changes the movement with respect to the x-y-z coordinate system obtained by movement of the tumble assembly and movement of the rotary bearing assembly. For example, by moving the swing arm into a position with 90 degrees of swing, rotation of the rotary bearing assembly constitutes rotation about the z axis and movement of the tumble assembly will constitute motion along the x axis. Thus, tumble motion (rotation about the z axis) may be obtained by motion of either the tumble assembly or the rotary bearing assembly and twist motion (rotation around the x axis) may be obtained by motion of either the tumble assembly or the rotary bearing assembly. However, irrespective of the movement of the swing arm, the movement of the tumble assembly has a component of its motion which constitutes motion along the y axis. It is this movement along the y axis that allows for full compensation for sag.

A motor is used to allow for the control of twist motion. The motor drives a gear box which drives a shaft that has a sprocket attached. The sprocket drives a chain which extends around the head flange so as to rotate the head flange and the test head. The motorized drive system is incorporated into a manual rotation system such that a full range of movement may be accomplished manually or may be accomplished using the motor. Moreover, easy control of motion is provided by the present invention since the motor operates at variable speeds and since position may be fine tuned by manual operation.

One advantage of the present invention is the fact that there is no yoke. Therefore, the test head is more accessible and is more easily manipulated. In addition, there is no bulky structure surrounding the testing head. Therefore, the testing head may be manipulated into areas that could not be accommodated for by prior art designs.

Another advantage of the present invention is that the horizontal range of motion is expanded by the use of the horizontal rail since the arm may extend from a full range of positions that lie along the length of the horizontal rail. Thus, movement is provided for within multiple arcs extending from various points along the horizontal rail. This not only expands the manipulator's outer range of movement, but also, it allows for horizontal motion within areas that are not accessible by designs in which the arm simply extends from the center of the tester. Yet another advantage of the present invention is the broad range of vertical motion. This allows the test head to be moved into a broader range of positions. This is particularly useful for moving the test head out of the way when the tester is not in use.

Another advantage of the present invention is that the swing arm may extend and retract, thus broadening horizontal range of motion from the limited arc of prior art designs to a broad range of horizontal motion. This broad range of horizontal motion includes the full area between the outer arc of the test head when the arm is in the fully extended position and an arc defined by the arm's motion when the arm is in the fully retracted position for each horizontal position along the horizontal rail. Another advantage of the present invention is that the manipulator may pivot so as to allow for a full range of swing motion. Yet another advantage of the present invention is that the test head may move within a full range with respect to tumble motion. In addition, the tumble motion may be easily controlled and adjusted. This allows the test head to accommodate a wide range of positions not accessible by prior art devices.

Another advantage of the present invention is the full range of twist motion. This allows the test head to accommodate DUT up, DUT down and DUT side testing. The range of motion and the freedom of motion allowed by the design allows the test head to be quickly rotated into the various positions. Moreover, the twist motor allows this motion to be made with a high degree of control and accuracy and with little physical exertion by the operator.

Still another advantage of the present invention is control of motion with respect to sag. Compensation for sag is accomplished by rotation about the tumble assembly. This allows the electronics package to remain centrally aligned and locked within the test head. Thereby avoiding potential damage to electronic components within the electronics package due to motion of the electronics package within the test head. In addition, by allowing for a full range of sag motion, the present invention allows for testing in situations where prior art testers cannot compensate for the full amount of sag due to limitations in testing surface rotation. Yet another advantage is provided by the use of improved rail assemblies that allow for smooth movement of the manipulator components and which provide for a reduced footprint. Moreover, the different components of the present invention provide that tumble motion and twist motion may be obtained by motion of different components of the present invention. In particular, tumble motion or twist motion may be obtained by moving either the tumble assembly or the rotary bearing assembly, depending on the rotation of the swing arm. Thus, not only is a broader range of motion provided for than is allowed by prior art testers, but more flexibility in achieving a specific position is provided for.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5b is an expanded view of cable trays and an expansion joint and horizontal and vertical rail assemblies in accordance with the present invention.

FIG. 9 is a perspective view illustrating a tester with a manipulator in a DUT side position with a swing arm having 0 degrees of swing rotation and an expansion joint in the fully expanded position and a rotary bearing assembly having 90 degrees of twist rotation in accordance with the present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
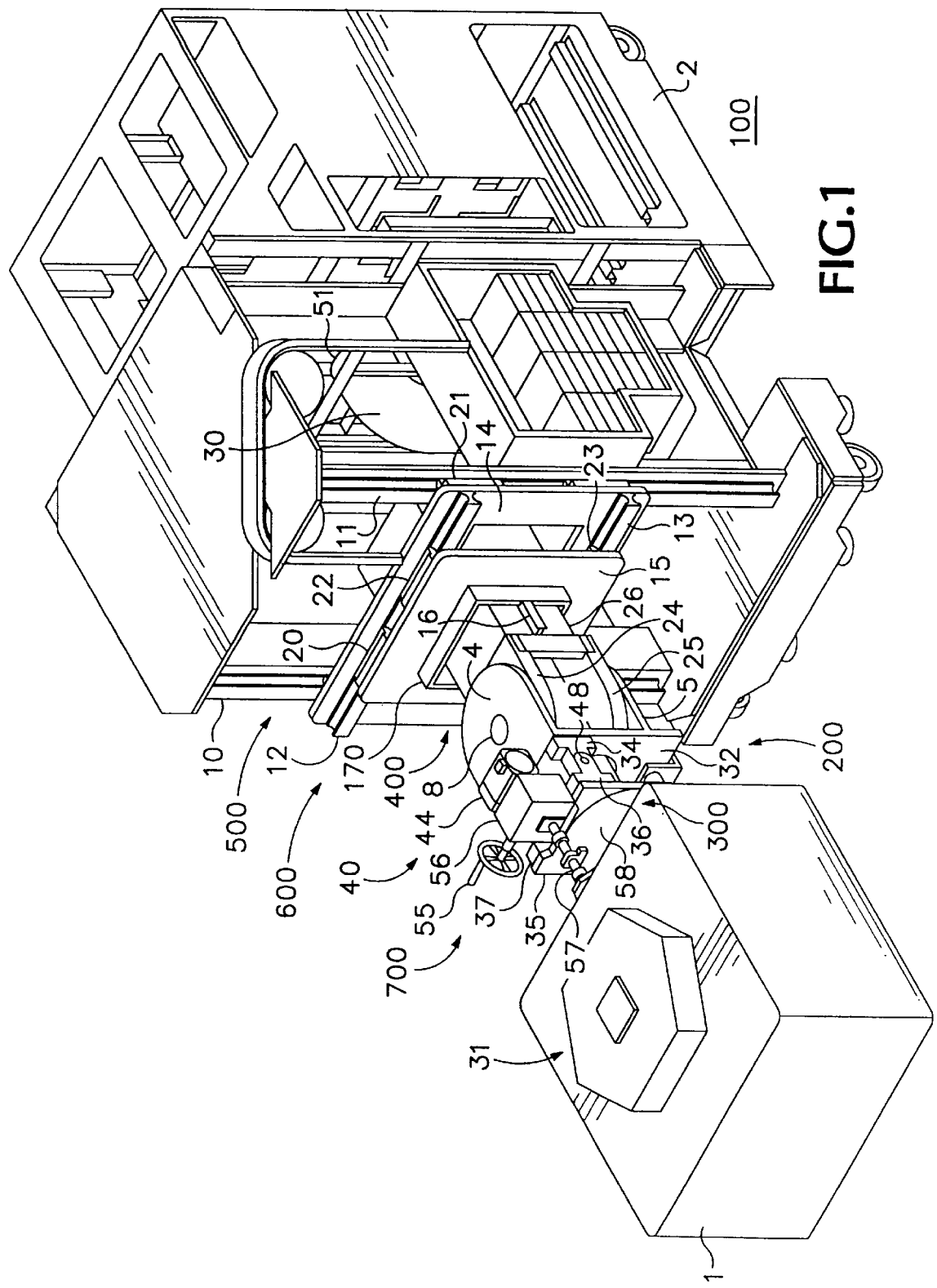
FIG. 1 is a front perspective view illustrating a tester including a manipulator in a DUT up position with a swing arm having 0 degrees of swing rotation in accordance with the present invention.

FIG. 1 shows tester 100 to include cable 30 which couples test head 1 to external devices and to power supply sources and to plumbing for cooling and pressure testing. Tester 100 also includes frame 2 to which manipulator 200 is attached. Manipulator 200 allows test head 1 to be moved within a broad range of motion such that testing surface 31 may be moved to accommodate a wide range of testing configurations. Frame 2 includes cable coupling 51 which secures cable 30 to frame 2. Cable 30 is sufficiently long and has slack to accommodate lateral extension of manipulator 200. When manipulator is in the retracted position, excess cable from cable 30 is stored in a loop within frame 2. This loop allows manipulator 200 to be laterally extended and retracted. When manipulator 200 is in the fully retracted position, the loop is at its maximum size, with the loop growing smaller as manipulator 200 is extended into the fully extended position. In the fully extended position, cable 30 is fully extended into manipulator 200 and the loop is eliminated. Manipulator 200 includes vertical rail assembly 500 which includes vertical rails 10–11 which are attached to frame 2 and vertical bearing assemblies 20–21. Vertical rail 10 receives vertical bearing assembly 20 and vertical rail 11 receives vertical bearing assembly 21 so as to allow vertical rail plate 14 to move smoothly up and down with respect to frame 2. Horizontal rail assembly 600 includes horizontal rails 12–13 which are connected to vertical rail plate 14. Horizontal rail assembly 600 also includes upper horizontal bearing assembly 22 and lower horizontal bearing assembly 23. Horizontal movement is provided by the engagement of upper horizontal bearing assembly 22 with horizontal rail 12 and the engagement of lower horizontal bearing assembly 23 with horizontal rail 13. Upper horizontal bearing assembly 22 and lower horizontal bearing assembly 23 are attached to horizontal rail plate 15 so as to allow horizontal rail plate 15 to move horizontally with respect to vertical rail plate 14. In one embodiment, vertical rails 10–11 have a length sufficient so as to allow for 73 inches of vertical movement. Upper horizontal rail 12 and lower horizontal rail 13 have lengths sufficient so as to allow horizontal rail plate 15 to move a total of 8 inches horizontally. Support box 170 is attached to horizontal rail plate 15.

Cable housing 26 of FIG. 1 is secured to support box 170 by lateral rails 16–17 (FIG. 5a) and lateral bearing assemblies 18–19 so as to allow cable housing 26 to extend and retract laterally. Lateral rails 16–17 are sufficiently long so as to allow for cable housing 26 to be extended a total of 6 inches. Extending from the top and bottom sides of cable housing 26 are upper cable housing flange 24 and lower cable housing flange 25. Swing arm 40 includes upper swing coupling flanges 4 and lower swing coupling flange 5. Pivot pin 8 engages an opening in upper cable housing flange 24 and a corresponding opening in upper swing coupling flange 4. Pivot pin 9 engages an opening in lower cable housing flange 25 and a corresponding opening in lower swing coupling flange 5. The engagement of pivot pins 8–9 with upper cable housing flange 24 and lower cable housing flange 25 and upper swing coupling flange 4 and lower swing coupling flange 5 attaches cable housing 26 to swing arm 40 such that swing arm 40 may rotate.

Swing arm 40 of FIG. 1 freely rotates with respect to cable housing 26 a full ninety degrees to each side. Swing arm 40 is shown to include swing plate 32 and tumble brackets 33–34. Swing arm 40 attaches to tumble plate 35 via pins 47–48 which couple tumble flanges 36–37 to tumble brackets 33–34.

Figure 2:
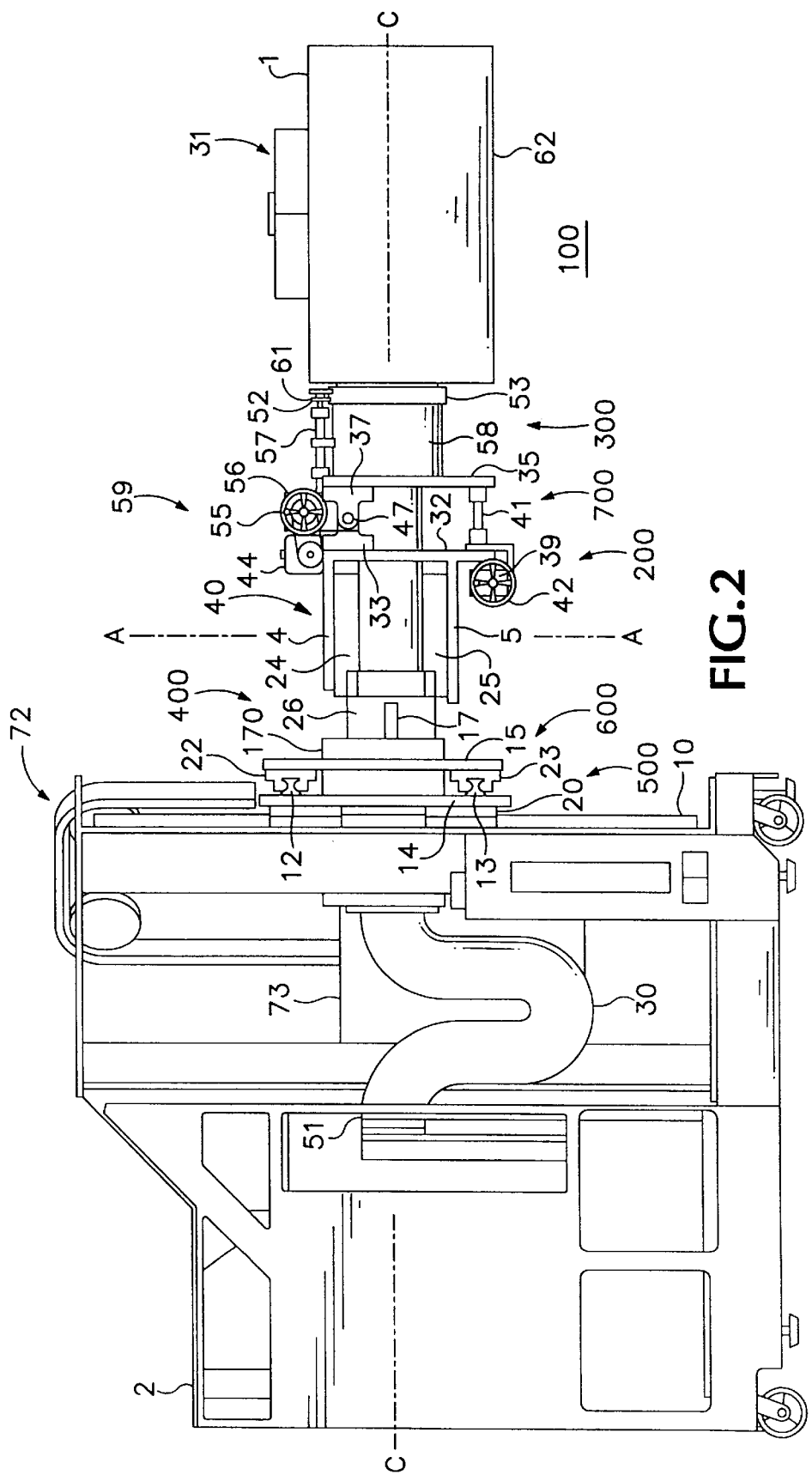
FIG. 2 is a right side view illustrating a tester including a manipulator in a DUT up position with a swing arm having 0 degrees of swing rotation in accordance with the present invention.

FIG. 2 shows a side view of tester 100 when cable housing 26 is in the fully retracted position. It can be seen that the profile of the manipulator 200 is streamlined. That is, the various components that allow test head 1 to be positioned do not add an excess of length to tester 100. This is significant since test head 1 is quite heavy. Thus, the longer the manipulator, the more weight that must be designed into the frame to counterbalance the weight of head 1. This streamlined length is in part due to the design of vertical rail assembly 500 and horizontal rail assembly 600. Horizontal rail assembly 600 includes horizontal rails 12–13 and horizontal bearing assemblies 22–23. Vertical rail assembly 500 includes vertical rails 10–11 and vertical bearing assemblies 20–21. The bearings of horizontal bearing assemblies 22–23 and vertical bearing assemblies 20–21 engage the sides of horizontal rails 12–13 and vertical rails 10–11. This design minimizes the length of the component parts. Preferably, each of rail assemblies 500, 600 incorporates the use of accu-glide bearings for smooth and uniform movement. Accu-glide bearings are used because they allow for higher speeds, they have a lower coefficient of friction, they allow for uniform loading of bearings and they have a lower profile than prior art bearing assemblies. Accu-glide bearing assemblies are manufactured by Thompson Bay Company, Inc. of Port Washington, N.Y. Incorporated into each of horizontal rail assembly 600 and vertical rail assembly 500 are locking screws so as to allow for locking each of horizontal rail assemblies 600 and vertical rail assemblies 500 in place once they are properly positioned.

Cable housing 26 of FIG. 2 couples to support box 170 such that cable housing 26 may move laterally. Cable housing 26 couples to swing arm 40 by pivot pins 8–9 such that swing arm 40 may pivot about axis A—A a full ninety degrees to each side.

Figure 3:
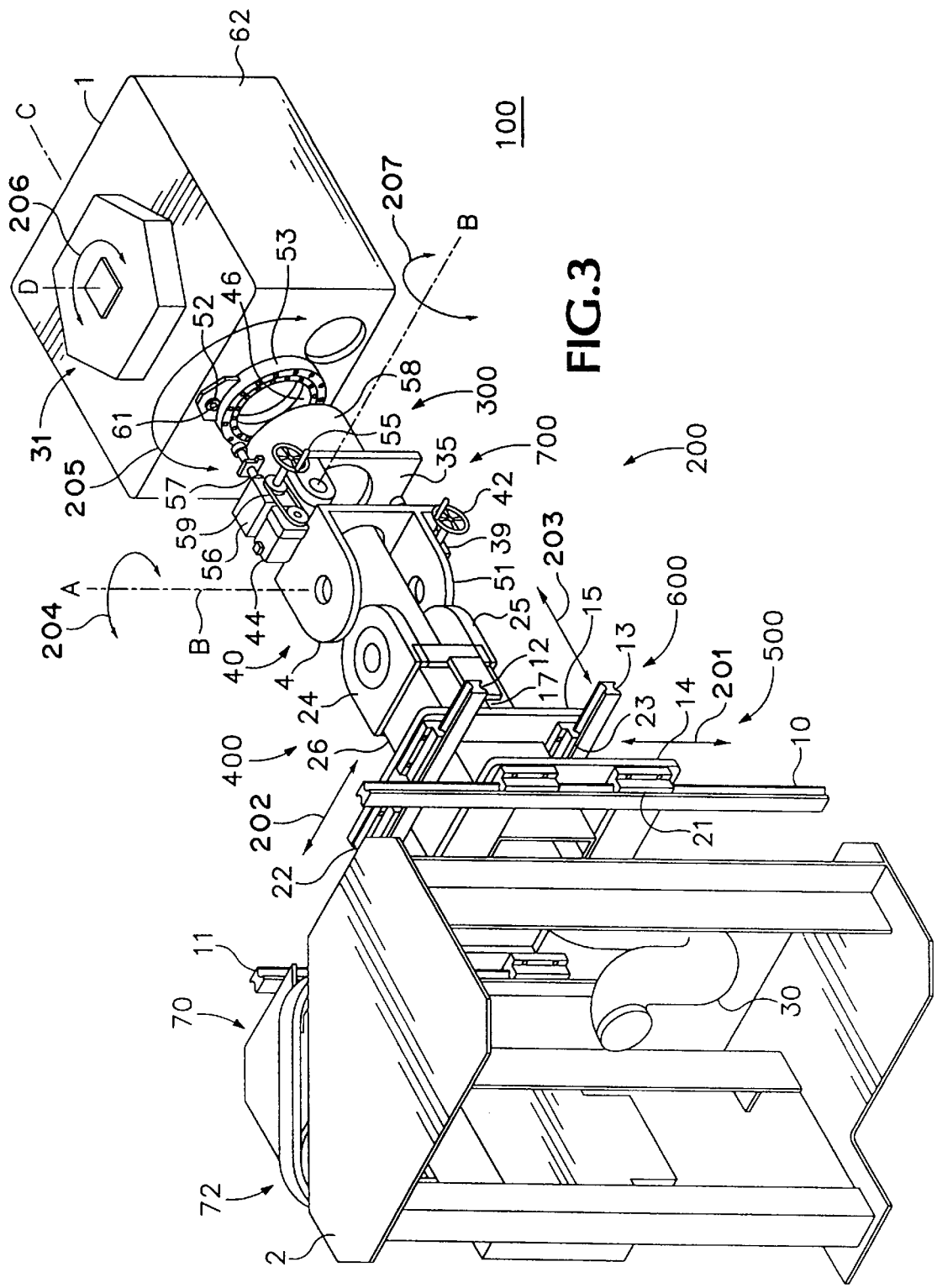
FIG. 3 is a left side view illustrating a expanded view of a tester including a manipulator in a DUT up position with a swing arm having 0 degrees of swing rotation in accordance with the present invention.

When swing arm 40 of FIG. 2 is in the 0 degree of swing position, tumble motion is provided by movement of tumble assembly 700 which includes pivot pins 47–48 and tumble control screw 41. Rotation about the centerline of pins 47–48, referred to as rotation about tumble axis B—B of FIG. 3, is controlled by tumble control screw 41 of FIG. 2 which is operated by manual movement of tumble control screw handle 42. Tumble control screw handle 42 operates gears 39 that rotate tumble control screw 42 so as to move tumble plate 35.

When the swing arm 40 of FIG. 2 is in the 0 degree of swing position and when tumble rotation is 0 degrees, twist rotation is obtained by rotation of rotary bearing assembly 300. Rotary bearing assembly 300 includes head flange 46 of FIG. 3 and twist flange 53. Twist flange 53 is attached to mounting flange 58. Head flange 46 of FIG. 3 is connected to test head 1 and test head frame 62. Rotary bearings 54 of FIG. 4 couple head flange 46 to twist flange 53 such that head flange 46 may freely rotate with respect to twist flange 53 about axis C—C of FIG. 3 which runs through the center of rotary bearing assembly 300. Test head 1 includes test head frame 62 which is attached to head flange 46 such that test head 1 rotates with the rotation of head flange 46. Twist control motor 44 rotates the gears in gearbox 56 so as to provide rotation to shaft 57. Twist control motor 44 is coupled to gearbox 56 by belt assembly 59. Shaft 57 rotates sprocket 61 which rotates chain 52. Chain 52 extends around head flange 46 so as to rotate head flange 46. Head flange 46 is coupled to test head frame 62 such that test head frame 62 and test head 1 rotate with the rotation of head flange 46. Twist control motor 44 is an electric motor which operates at two speeds, slow and fast and which is operated by a control pad that couples to twist control motor 44. In addition to motorized twist operation, manual operation is obtained by rotating wheel 55 so as to operate gearbox 56. This allows for the position of head 1 to be adjusted both manually and electrically as required to properly position test head 1 as needed. Testing surface 31 is coupled to test head frame 62 such that it may rotate within a narrow range.

The ranges of rotational motion provided by manipulator 200 of FIG. 3 include rotation around axis A—A, axis B—B, axis C—C, and axis D—D. Swing arm 40 pivots around axis A—A so as to allow for swing motion as illustrated by arrow 204. When swing arm 40 has 0 degrees of rotation about axis A—A, tumble motion is provided for by movement of tumble assembly 700 about axis B—B as shown by arrow 207. When swing arm 40 has 0 degrees of rotation about axis A—A, head flange 46 and test head 1 rotate about axis C—C so as to provide twist motion as shown by arrow 205. Further control is provided by theta motion which results from the rotation of testing surface 31 along axis D—D as shown by arrow 206. Linear motion of test head 1 is provided by vertical motion as shown by arrow 201 and horizontal motion as shown by arrow 202 and lateral motion as shown by arrow 203.

Figure 4:
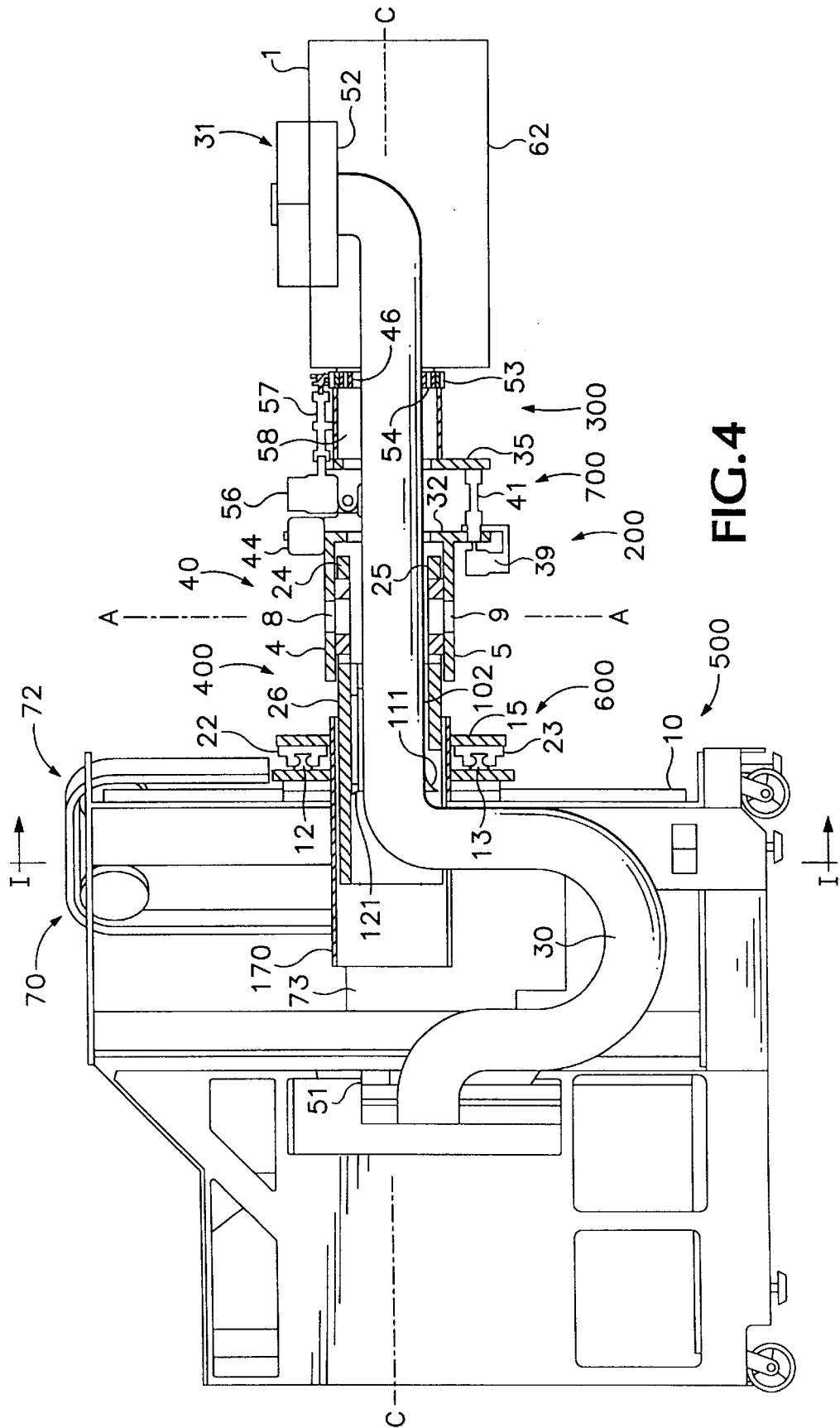
FIG. 4 is a left side cross sectional view along axis C—C of FIG. 3 illustrating a tester including a manipulator in a DUT up position with a swing arm having 0 degrees of swing rotation in accordance with the present invention.

FIG. 4 shows cables 30 to extend through manipulator 200 and into head 1. Within head 1, cables 30 connect to electronic circuits 52 which couple to testing surface 31. Some of cables 30 are supported by cable tray 102 which includes contoured flange 111. Counterbalance system 70 includes weight 73 and cable-and-pulley system 72 which is coupled to vertical rail plate 14. Counterbalance system 70 applies force to vertical rail plate 14 so as to compensate for the heavy weight of cable 30, manipulator 200 and test head 1 so as to allow for the easy movement of manipulator 200 vertically.

FIGS. 9–12 illustrate the range of motion provided by the present invention with reference to a standard x-y-z coordinate system. The freedom of movement of the present invention allows for expanded motion with respect to horizontal, vertical, twist and tumble motion. Expansion and contraction of expansion joint 400 constitutes movement along the x axis. Movement of vertical rail assembly 500 allows for motion along the y axis and movement of horizontal rail assembly 600 allows for movement along the z axis.

Figure 10:
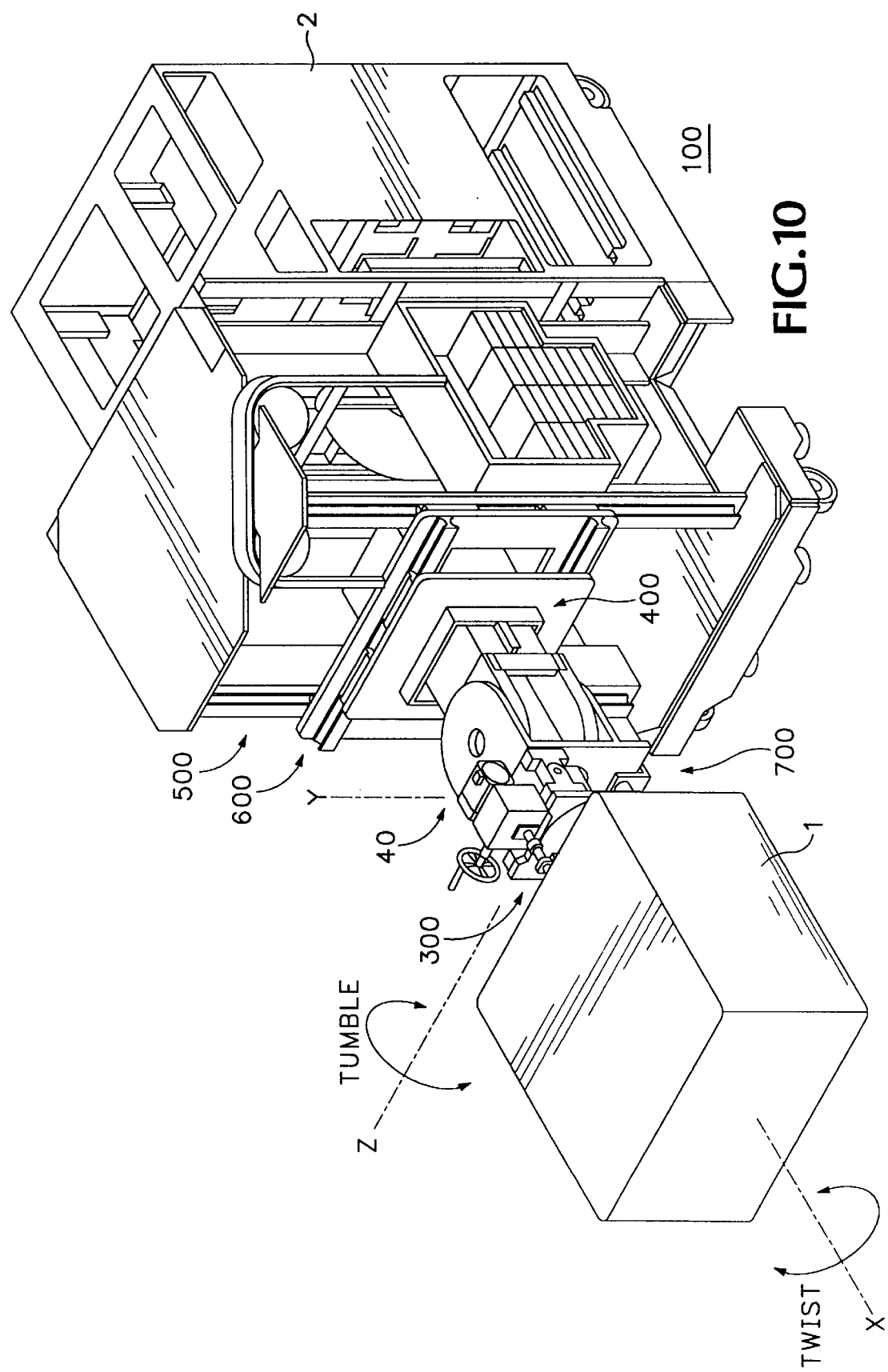
FIG. 10 is a perspective view illustrating a tester with a manipulator in a DUT down position with a swing arm having 0 degrees of swing rotation and an expansion joint in the fully expanded position and a rotary bearing assembly having 180 degrees of twist rotation in accordance with the present invention.

FIGS. 9–10 show positions illustrating swing arm 40 rotated with 0 degrees of swing such that the longitudinal axis of swing arm 40 extends along the x axis. In this position, rotation of rotary bearing assembly 300 provides rotation about the x axis, commonly referred to as "twist" rotation and rotation of tumble assembly 700 provides rotation about the z axis, commonly referred to as "tumble" rotation.

FIG. 9 shows tester 100 in a position suitable for DUT side testing. This DUT side testing position may be obtained by rotating rotary bearing assembly 300 so as to apply 90 degrees of rotation to rotary bearing assembly 300. FIG. 10 shows tester 100 in a position suitable for DUT down testing. This DUT down testing position may be obtained by rotation of rotary bearing assembly 300 so as to apply 180 degrees of rotation to rotary bearing assembly 300. In FIGS. 9–10, movement of the tumble assembly 700 allows for motion along the z axis and along the y axis such that the user may fully compensate for sag by movement of tumble assembly 700.

Figure 11:
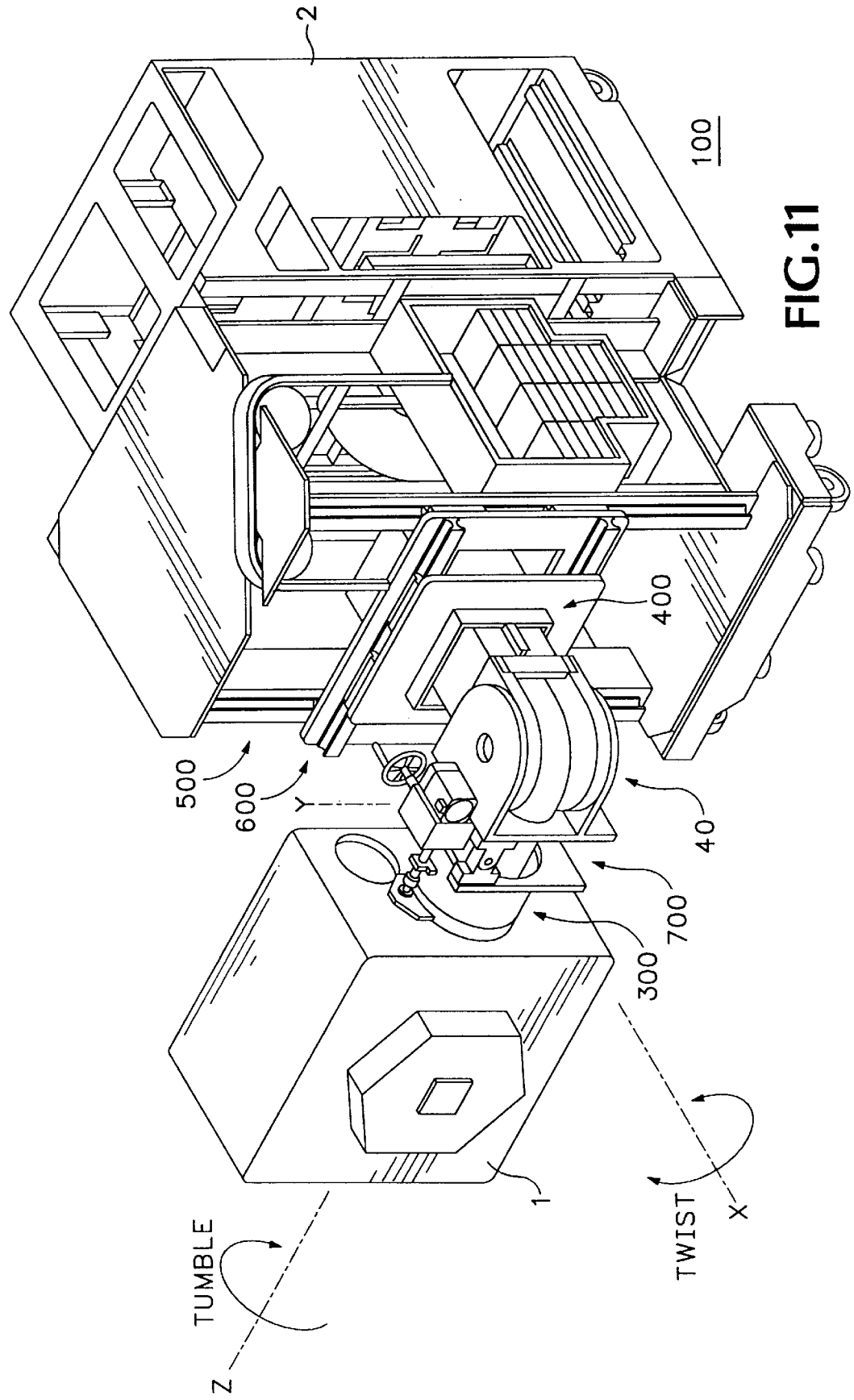
FIG. 11 is a perspective view illustrating a tester with a manipulator in a DUT side position with a swing arm having 90 degrees of swing rotation and an expansion joint in the fully expanded position and a rotary bearing assembly having 90 degrees of tumble rotation in accordance with the present invention.
Figure 12:
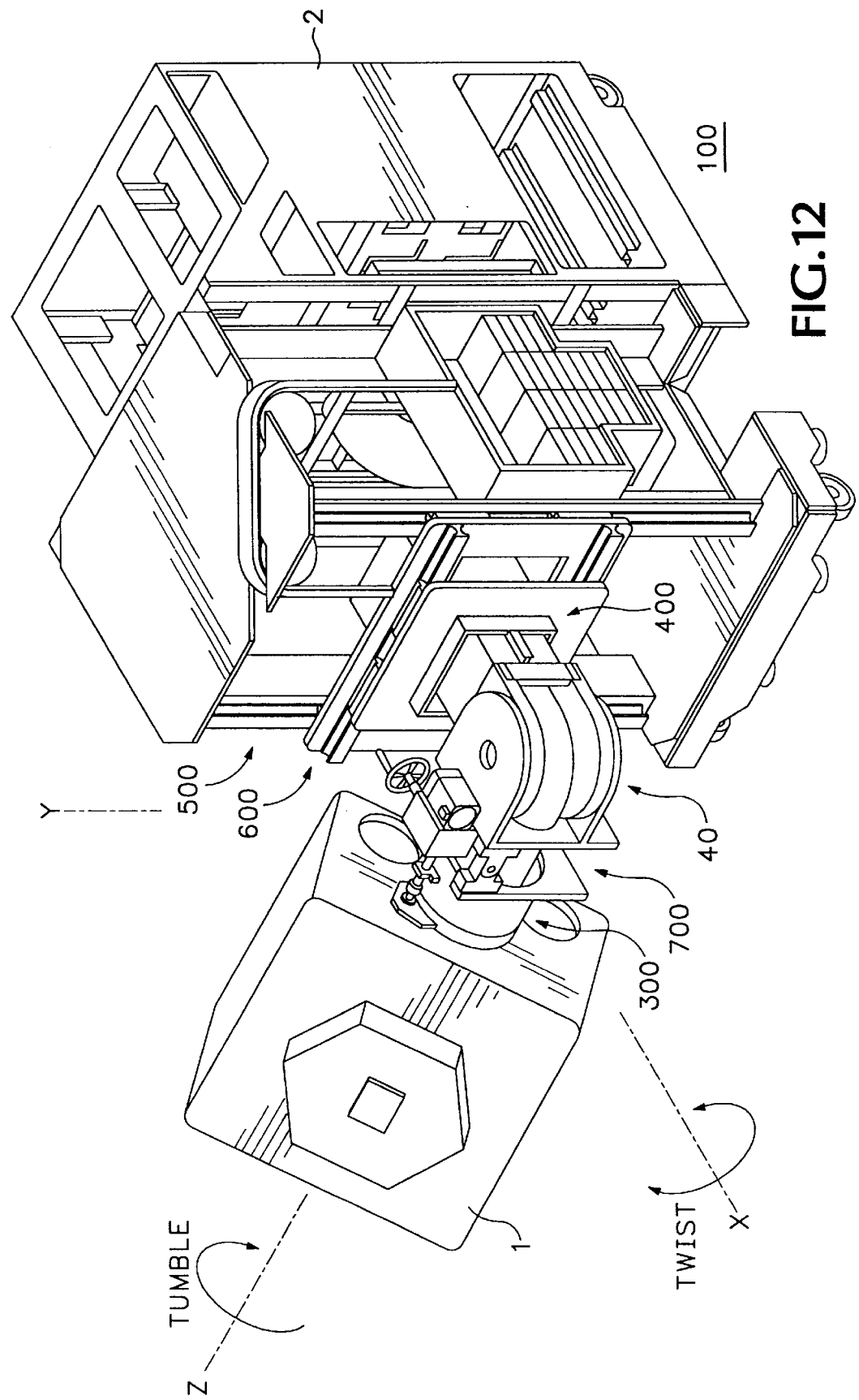
FIG. 12 is a perspective view illustrating a tester with a swing arm having 90 degrees of swing rotation to the left and an expansion joint in the fully expanded position and a rotary bearing assembly having 45 degrees of tumble rotation in accordance with the present invention.
Figure 13:
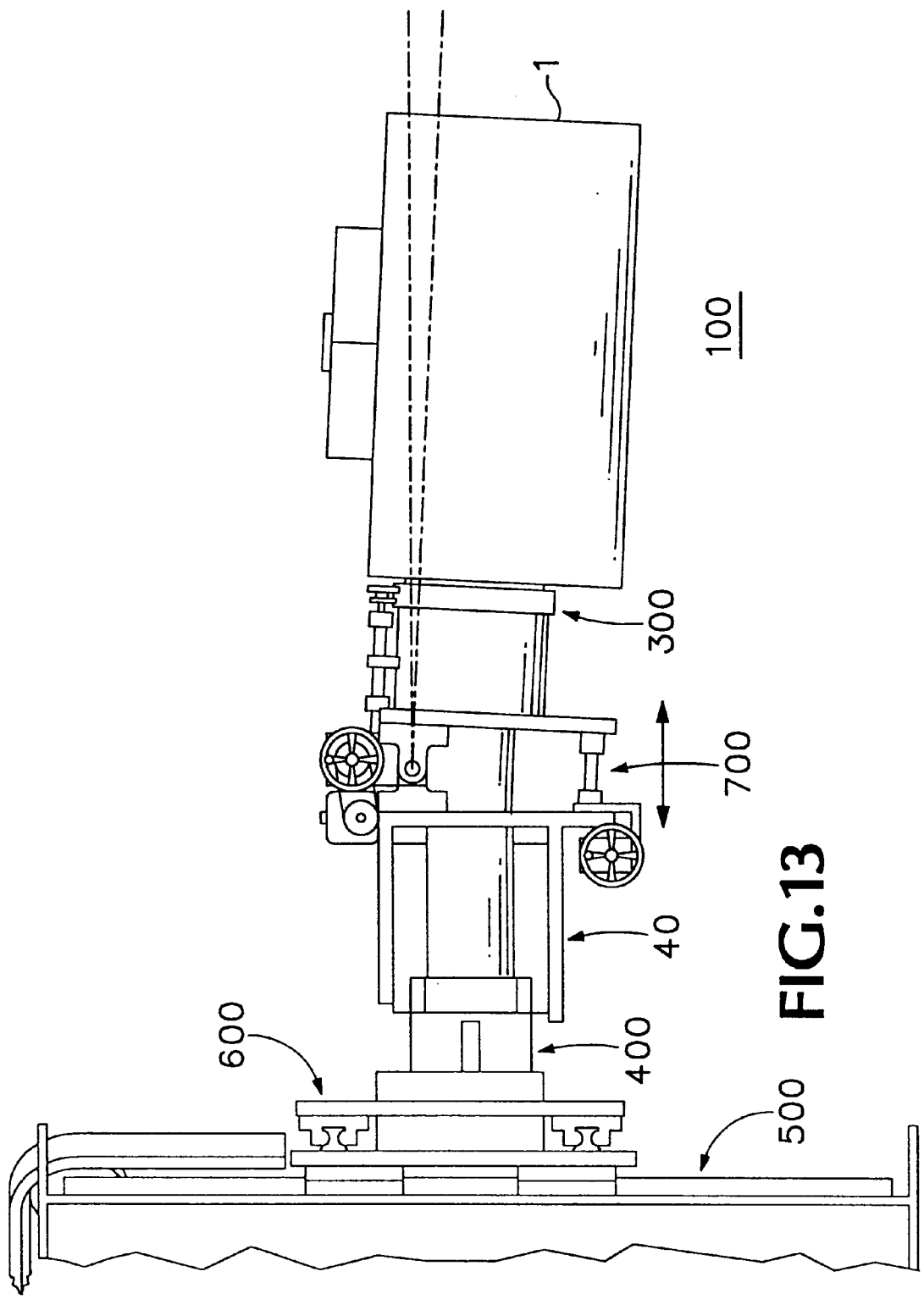
FIG. 13 is a side view illustrating a tester with 2.5 degrees of upward rotation of the tumble assembly in accordance with the present invention.
Figure 14:
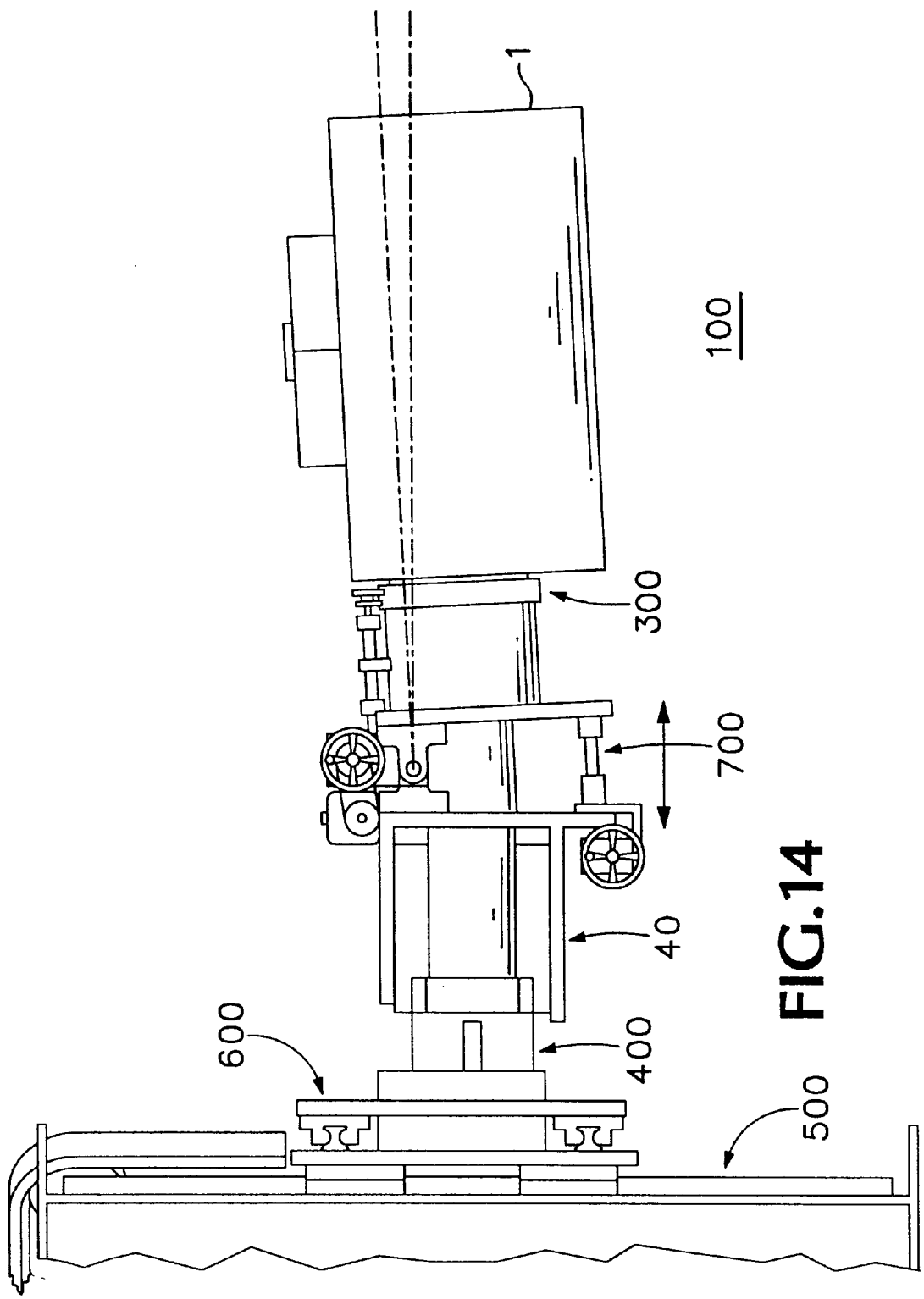
FIG. 14 is a side view illustrating a tester with 2.5 degrees of downward rotation of the tumble assembly in accordance with the present invention.
Figure 15:
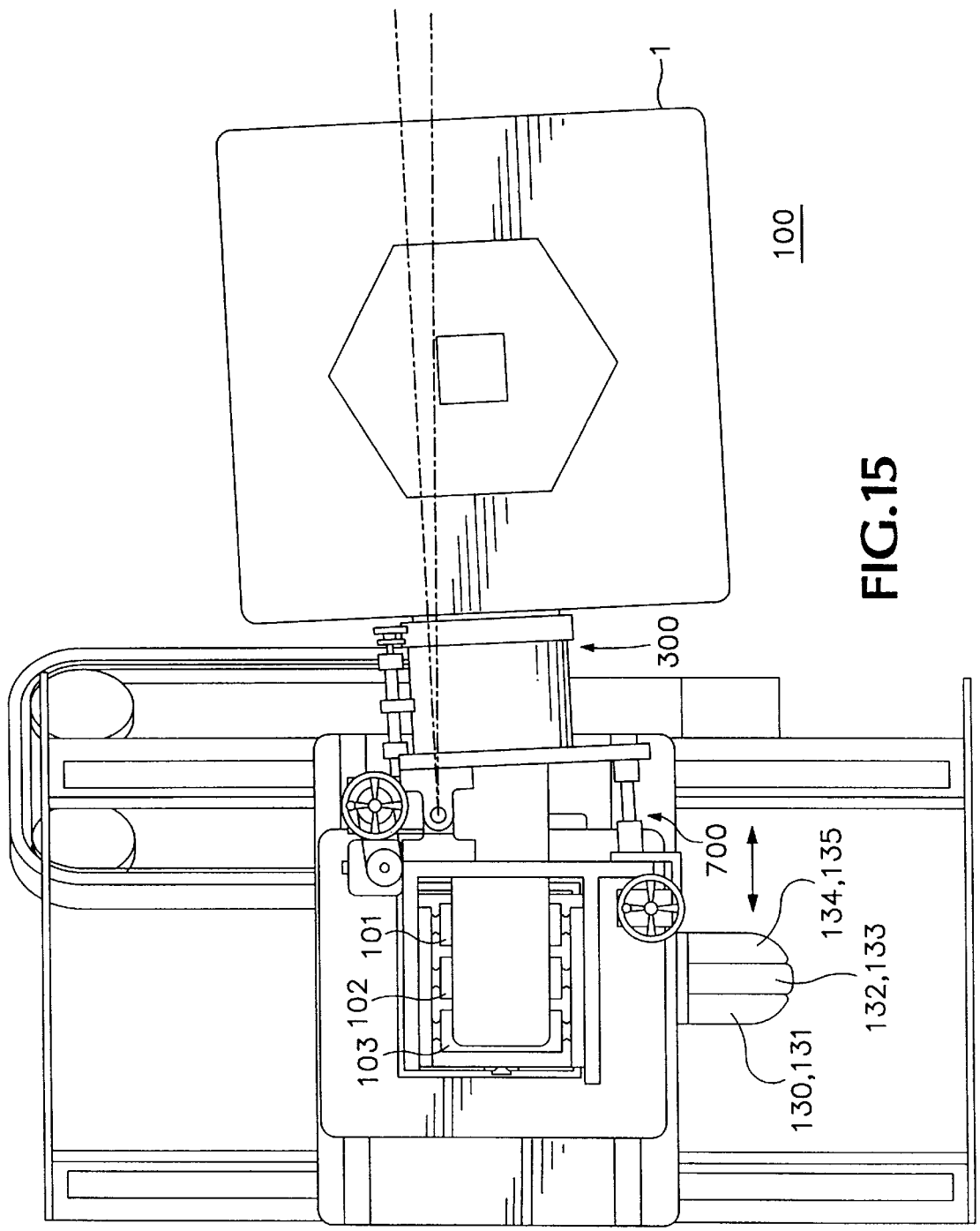
FIG. 15 is a front perspective view illustrating a tester with a manipulator in a DUT side position with a swing arm having 90 degrees of swing rotation to the right side and an expansion joint in the fully expanded position and a rotary bearing assembly having 90 degrees of tumble rotation with 2.5 degrees of upward rotation of the tumble assembly in accordance with the present invention.
Figure 16:
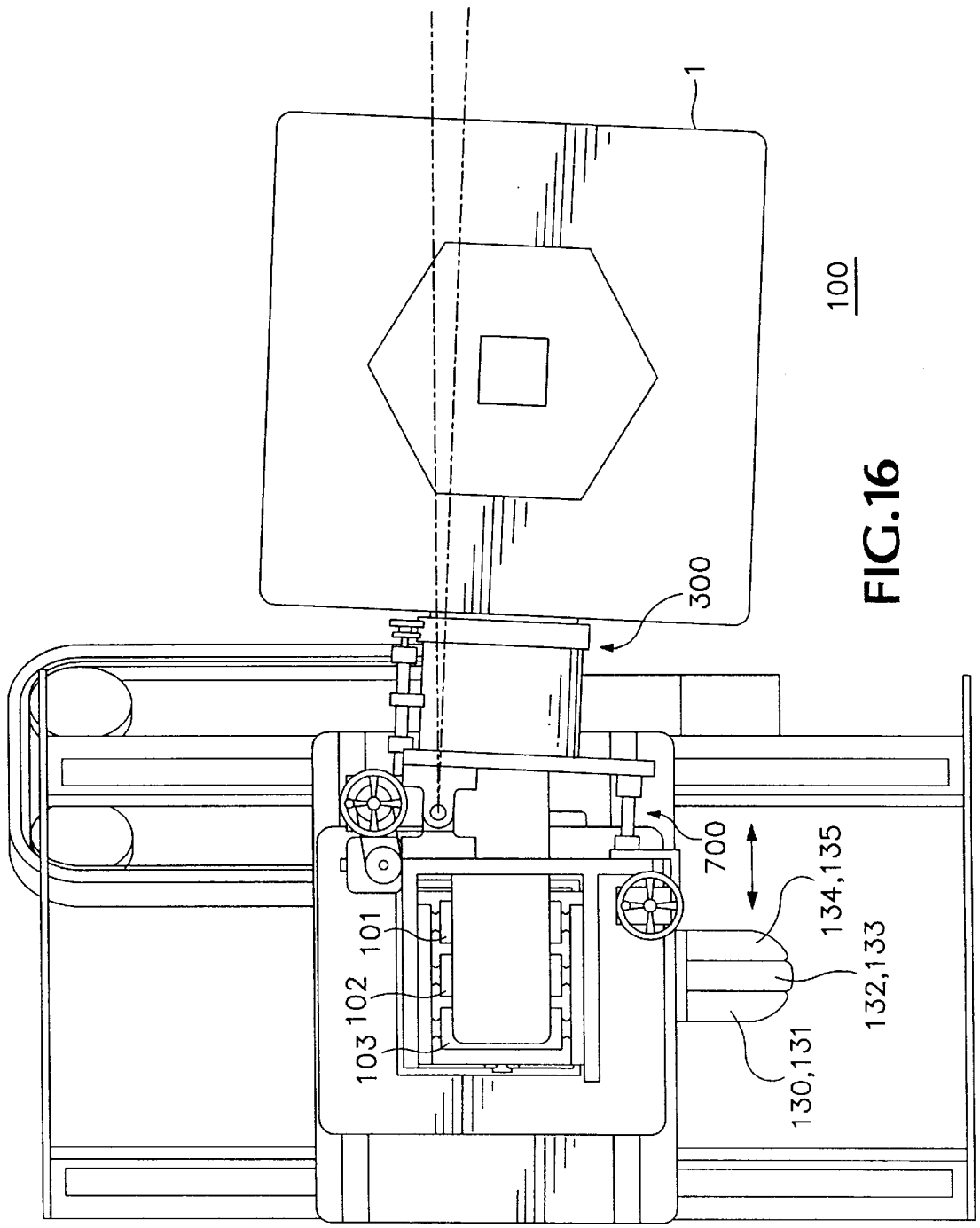
FIG. 16 is a front perspective view illustrating a tester with a manipulator in a DUT side position with a swing arm having 90 degrees of swing rotation to the right side and an expansion joint in the fully expanded position and a rotary bearing assembly having 90 degrees of tumble rotation with 2.5 degrees of downward rotation of the tumble assembly in accordance with the present invention.

Rotation of swing arm 40 constitutes movement along the x axis and along the z axis and changes the movement with respect to the x-y-z coordinate system obtained by movement of tumble assembly 700 and movement of rotary bearing assembly 300. FIGS. 11–12 show the x-y-z axis moved to reflect a new origin of the x-y-z axis which corresponds to the movement of swing arm 40. By moving swing arm 40 into a position with 90 degrees of swing as shown in FIGS. 11–12, rotation of rotary bearing assembly 300 constitutes rotation about the z axis and movement of tumble assembly 700 constitutes rotation around the x axis.

FIG. 11 shows tester 100 in a position suitable for DUT side testing. This DUT side testing position may be obtained by applying 90 degrees of twist rotation to rotary bearing assembly 300 and by swinging swing arm 40 fully to the left such that it is rotated 90 degrees to the left. FIG. 12 shows tester 100 in a position with rotary bearing assembly 300 rotated with 45 degrees of twist rotation and with swing arm 40 rotated 90 degrees to the left.

In FIGS. 11–12, since swing arm 40 is rotated into a position of ninety degrees of rotation, rotation of rotary bearing assembly 300 actually accomplishes tumble rotation (e.g. the same movement possible by moving tumble assembly 700 when swing arm 40 has 0 degrees of swing). Similarly, rotation of tumble assembly 700 actually accomplishes twist rotation (e.g. the same movement possible by moving rotary bearing assembly 300 when swing arm 40 has 0 degrees of swing).

As shown in FIGS. 9–12, tumble motion (rotation about the z axis) may be obtained by motion of either tumble assembly 700 or rotary bearing assembly 300 and twist motion (rotation around the x axis) may be obtained by motion of either tumble assembly 700 or rotary bearing assembly 300. However, irrespective of the movement of swing arm 40, the movement of tumble assembly 700 has a component of its motion which constitutes motion along the y axis. It is this movement along the y axis that allows for full compensation for sag.

Figure 5A:
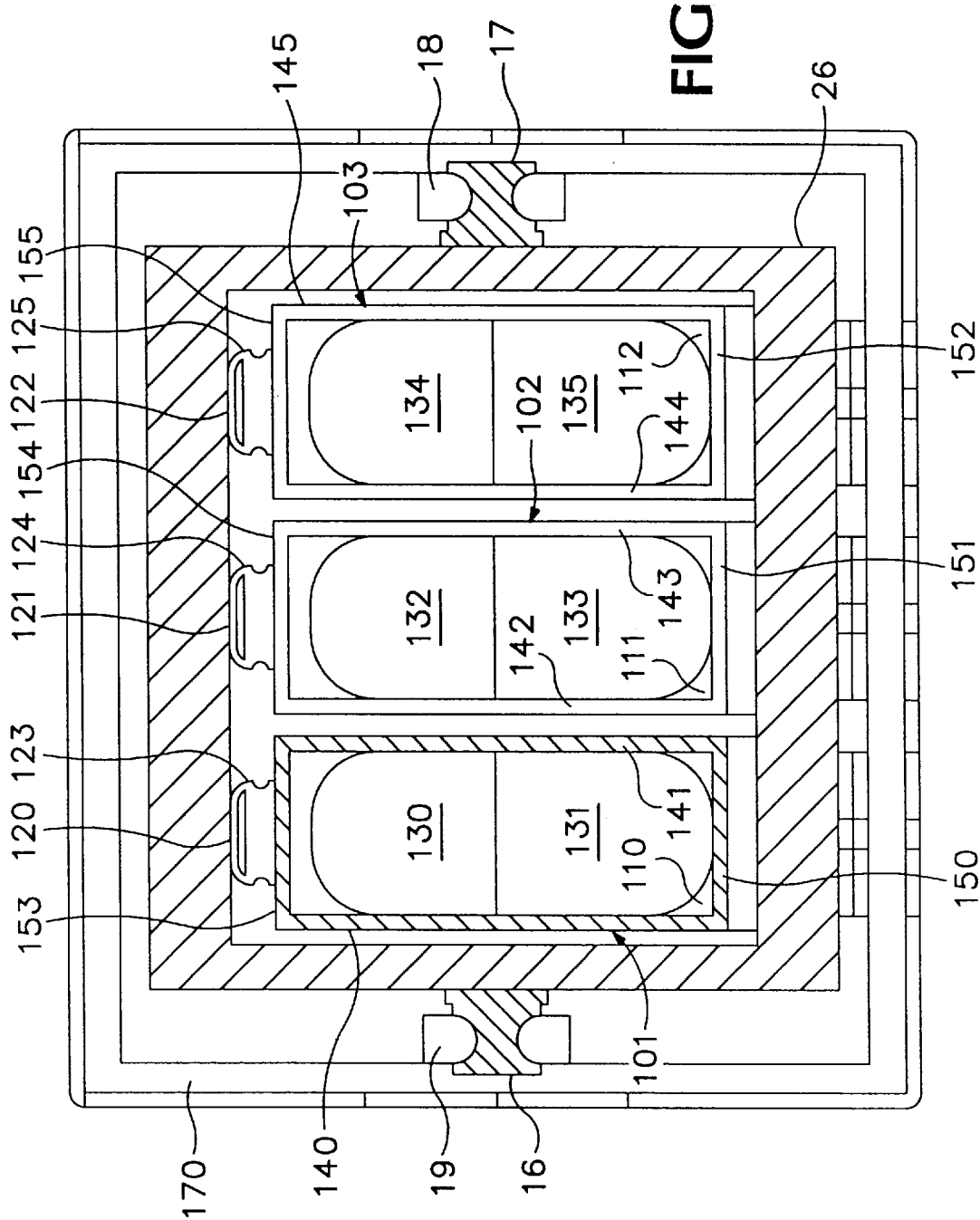
FIG. 5a is a cross sectional view along cross section I—I of FIG. 4 illustrating a tester including cable trays and cable in accordance with the present invention.

Expansion joint 400 of FIGS. 5a and 5b includes lateral rails 16–17, lateral bearing assemblies 18–19 and cable housing 26. Lateral rail 16 and lateral rail 17 lie on opposite sides of cable housing 26 and are attached to cable housing 26. Lateral bearing assemblies 18–19 are attached to opposite sides of support box 170. Lateral rail 16 engages with lateral bearing assembly 19 so as to allow for the lateral movement of cable housing 26. Similarly, lateral bearing assembly 18 engages lateral rail 17 so as to allow for the lateral movement of cable housing 26.

Contoured flange 110 of FIG. 5a extends from cable tray 101 so as to support cables 130–131. Contoured flange 111 extends from cable tray 102 so as to support cables 132–133. Similarly, contoured flange 112 extends from cable tray 103 so as to support cables 134–135. Contoured flanges 110–112, in addition to supporting cables 130–135, prevent cables 130–135 from being damaged by chafing against cable trays 101–103 as cable trays 101–103 move inward and outward.

Continuing with FIGS. 5a and 5b, cable tray 101 is attached to cable housing 26 by rail 120 and bearing assembly 123 such that cable tray 101 is allowed to move laterally inward and outward within cable housing 26. Cable tray 102 is attached to cable housing 26 by rail 121 and bearing assembly 124 such that cable tray 102 may move laterally within cable housing 26. Similarly, cable tray 103 is attached to cable housing 26 by rail 122 and bearing assembly 125 such that cable tray 103 may move laterally within cable housing 26.

Cable tray 101 of FIGS. 5a and 5b includes top panel 153 and bottom panel 150 and side panels 140–141. The height of side panels 140–141 is greater than the width of top panel 153 and the width of bottom panel 150. Cable tray 102 includes top panel 154 and bottom panel 151 and side panels 142–143. The height of side panels 142–143 is greater than the width of top panel 154 and the width of bottom panel 151. Similarly, cable tray 103 includes top panel 155 and bottom panel 152 and side panels 144–145 and the height of side panels 144–145 is greater than the width of top panel 154 and the width of bottom panel 152. Cable trays 101–103 support cables 130–135 and cables 130–131 are disposed within cable tray 101 and cables 132–133 are disposed in cable tray 102 and cables 134–135 are disposed in cable tray 103. Since cables 130–135 must flex horizontally to accommodate the rotation of swing arm 40 (not shown), cable trays 101–103 are designed to allow for horizontal flexing and rotation. Thus, the height of side panels 140–145 is greater than the width of top panels 153–155 and the width of bottom panels 150–152 such that cables 130–135 are disbursed such that they lie within cable trays 101–103 more vertically than horizontally. Thus, the side profiles of cables 130–135 are reduced, thus allowing cables 130–135 to flex horizontally to the right or to the left with reduced tension and compression on cables 130–135. In addition, the disbursement of cables into cable trays such that cables 130–135 are disposed more vertically than horizontally prevents cables from being bound up thereby allowing the cables to flex more than the range of flex in prior art cable assemblies.

The disbursement of cables into individual cable trays of FIG. 5a is based on the weight of each individual cable and the flexibility of the individual cable. Cables are distributed so as to roughly equalize the weight in each cable tray. Middle cable tray 102 does not move as much as do cable trays 101 and 103; therefore, cables 132–133 which are stiffer and larger and more fragile than the other cables are disposed in cable tray 102 so as to minimize their movement. Though the present invention is described with reference to the use of three cable trays, fewer or more cable trays could also be used. In an embodiment having more than three cable trays, the cables would be more widely disbursed, allowing for increased rotational movement, but adding cost and complexity to the manipulator design.

Figure 6:
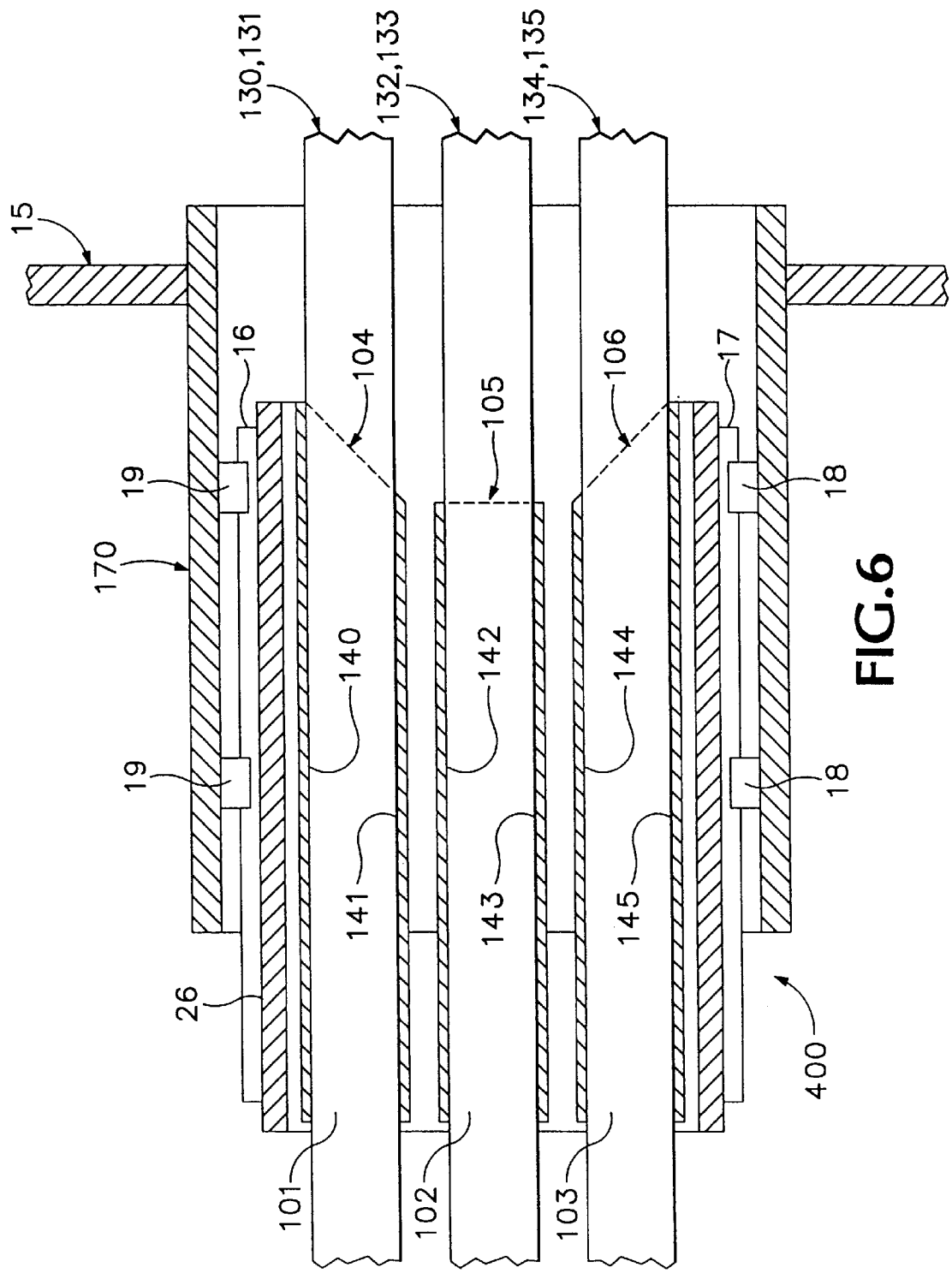
FIG. 6 shows a top cross sectional view along axis C—C of FIG. 4 illustrating an expanded view of a tester including a cable trays and cables with a manipulator in a DUT up position with a swing arm having 0 degrees of swing rotation and an expansion joint in the fully retracted position in accordance with the present invention.

FIG. 6 is a plan cut away view of the cable trays 101–103 of the present invention showing the length of outer side panel 140 to be longer than the length of inner side panel 141 such that front surface 104 of cable tray 101 has an angled profile. Side panels 142–143 have an equal length such that the profile of surface 105 is flat. The length of outer side panel 145 is longer than the length of inner side panel 144 such that front surface 106 of cable tray 101 has an angled profile. The angled profiles of front surfaces 104 and 106 allow for cables 130–131 and 134–135 to flex such that swing arm 40 (not shown) may rotate within a full ninety degree range of motion, the angled profile reducing tension and allowing for cables 130–131 to fully bend without being subject to binding tension from side panels 141 and 144 while providing the maximum cable tray length possible for more cable control.

Figure 7:
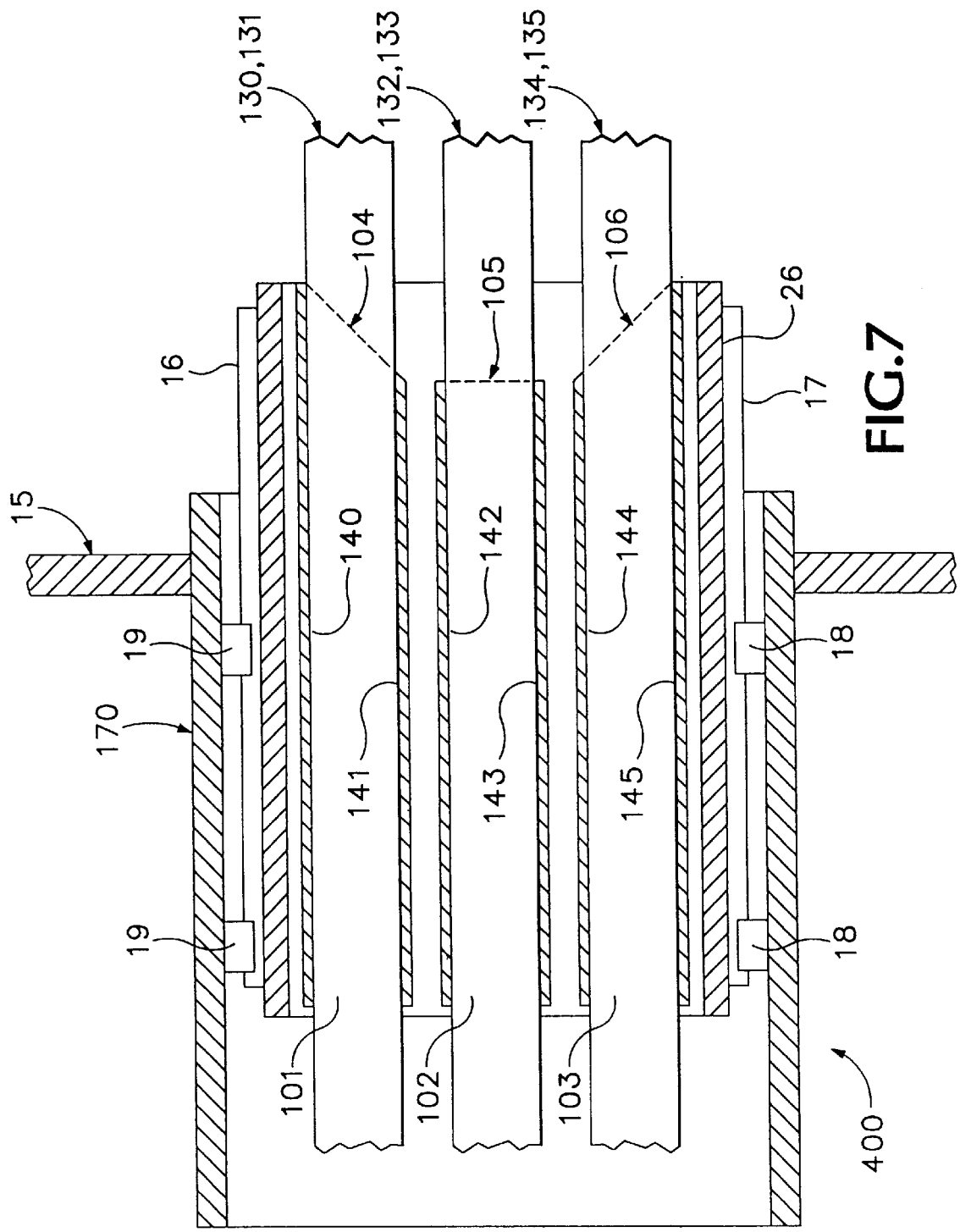
FIG. 7 shows a top cross sectional view along axis C—C of FIG. 4 illustrating an expanded view of a tester including cable trays and cables with a manipulator in a DUT up position with a swing arm having 0 degrees of swing rotation and an expansion joint in the fully expanded position in accordance with the present invention.

FIG. 7 shows the structure of FIG. 6 after the extension of expansion joint 400 into the fully extended position. Cables 130–135 move cable trays 101–103 forward so as to accommodate the movement of expansion joint 400.

Figure 8A:
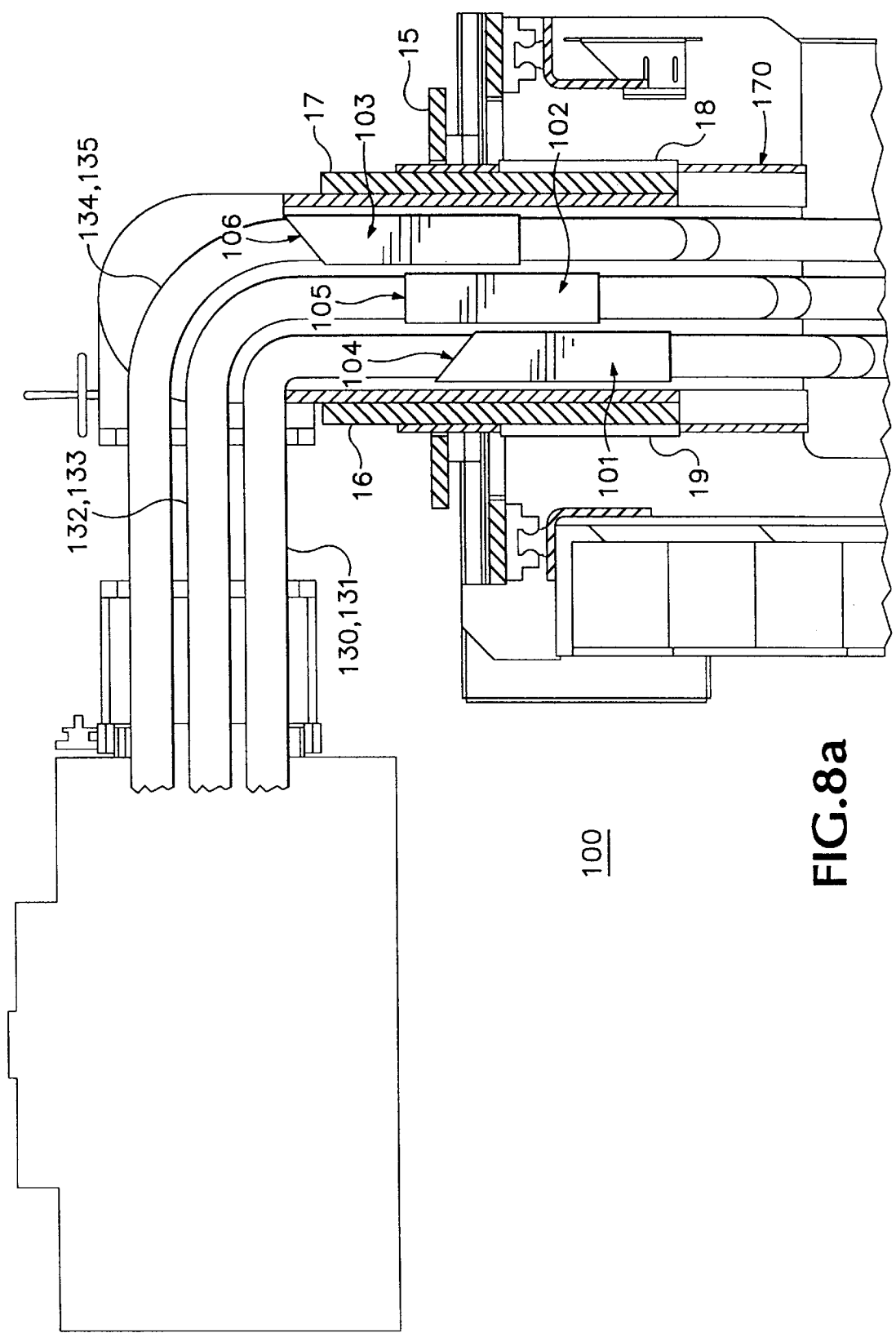
FIG. 8a shows a top cross sectional view along axis C—C of FIG. 4 illustrating an expanded view of a tester including a cable trays and cables with a manipulator in a DUT up position with a swing arm having 90 degrees of swing rotation to the right and an expansion joint in the fully expanded position in accordance with the present invention.

FIG. 8*a* shows the structure of FIG. 7 after swing arm 40 is moved into a position with 90 degrees of swing to the right. As swing arm 40 moves, cable tray 101 moves backwards to relieve the compression force on cables 130–131 resulting from the flexing of cables 130–131. Similarly, cable tray 102 moves backwards to relieve the compression force on cables 132–133 resulting from the flexing of cables 132–133. As swing arm 40 swings away from cable tray 103, cables 134–135 are placed in tension and cable tray 103 moves forward so as to reduce tension on cables 134–135. The angled profile of front surface 106 allows cables 134–135 to freely bend when swing arm 40 is rotated to the right. Not only does the angled profile of front surface 106 reduce tension in cables 134–135; but also, the angled profile allows for swing arm 40 to move within an expanded range of motion. Due to the reduction in tension and compression in cables 130–135, swing arm 40 may move within an arc of 90 degrees without damage to cables 130–135 and without applying an excessive amount of compression or tension to cables 130–135. In one embodiment, upon a full 90 degree rotation of swing arm 40 to the right, cable tray moves 6.18 inches backwards and cable tray 102 moves backwards a total of 1.96 inches while cable tray 103 moves forward a total of 2.26 inches.

Figure 8B:
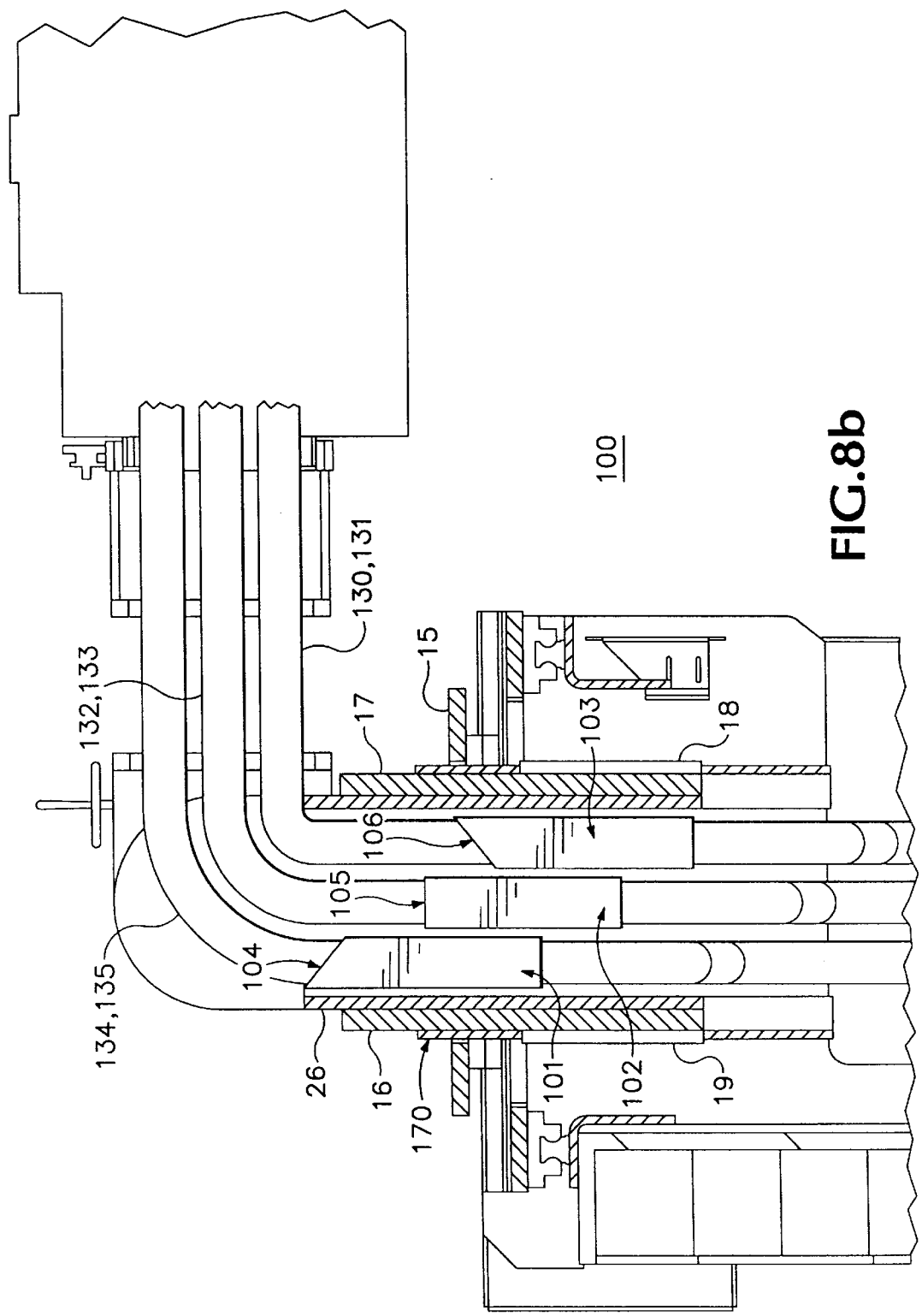
FIG. 8b shows a top cross sectional view along axis C—C of FIG. 4 illustrating an expanded view of a tester including a cable trays and cables with a manipulator in a DUT up position with a swing arm having 90 degrees of swing rotation to the left and an expansion joint in the fully expanded position in accordance with the present invention.

Movement of swing arm 40 into a position with 90 degrees of swing to the left moves cable tray 103 backwards as shown in FIG. 8*b*, moves cable tray 102 backwards and forwards and moves cable tray 101 forward so as to reduce tension and compression on cables 130–135. The angled profile of front surface 104 allows cables 134–135 to freely bend when swing arm 40 is rotated to the left.

Figure 8C:
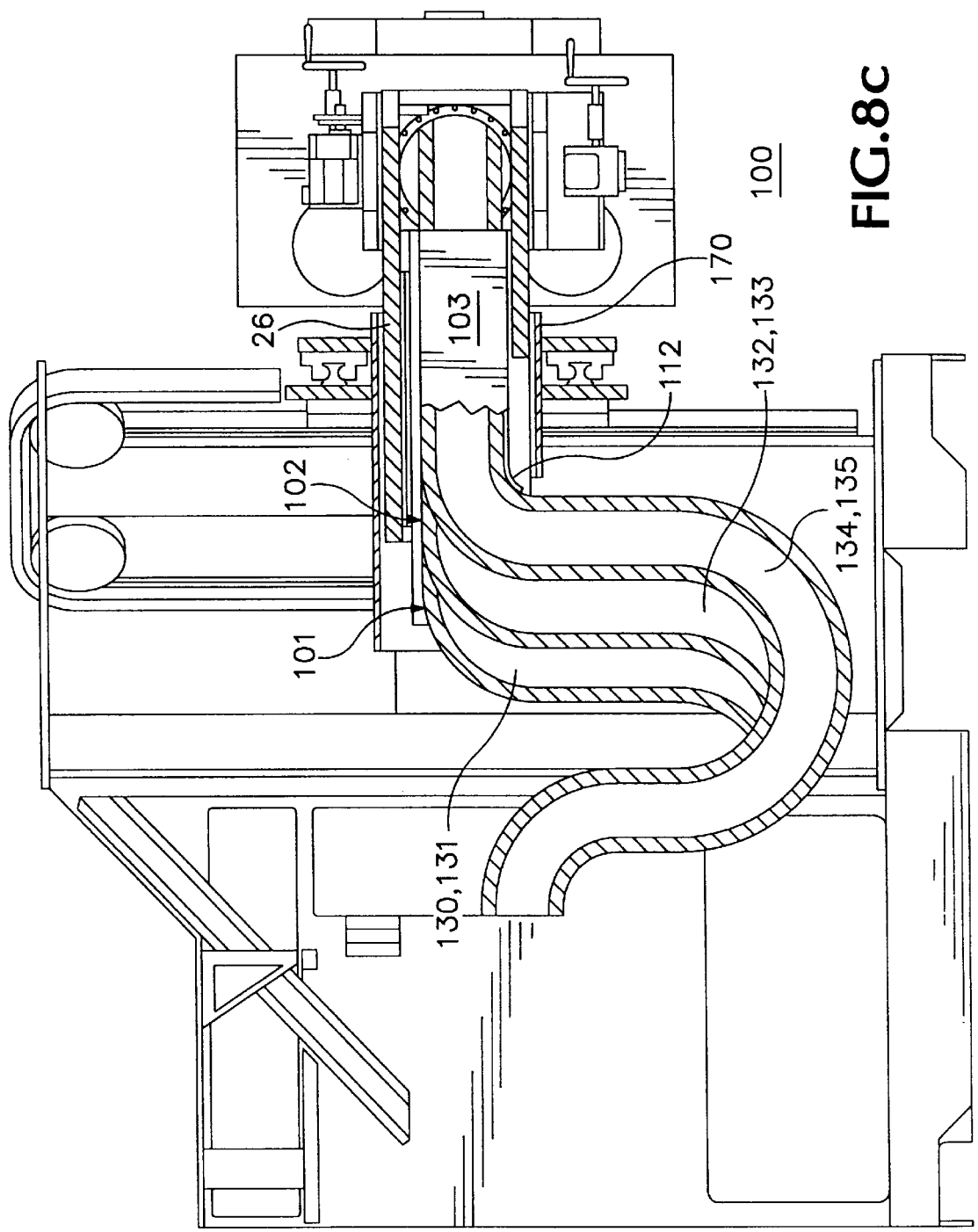
FIG. 8c shows a schematic side cross sectional view illustrating an expanded view of a tester including a cable trays and cables with a manipulator in a DUT up position with a swing arm having 90 degrees of swing rotation to the right and an expansion joint in the fully expanded position in accordance with the present invention.

FIG. 8*c* shows an expanded side profile of cable trays 101–103 when swing arm 40 is moved into a position with 90 degrees of swing to the left. Contoured flange 110 (not shown) is formed in cable tray 101 so as to support cables 130–131. Contoured flange 111 (not shown) is formed within cable tray 102 so as to support cables 132–133. Similarly, contoured flange 112 is formed within cable tray 103 so as to support cables 134–135. Contoured flanges 110–112, in addition to supporting cables 130–135, prevent cables 130–135 from being damaged by chafing against cable trays 101–103 as cable trays 101–103 move back and forth.

FIGS. 13–16 show movement of tumble assembly 700 up and down. This movement allows for the full compensation for sag. Thus, the present invention allows for the movement of test head into a full range of positions. The component systems work together to give smooth motion and easy control of the head such that testing may be accomplished for DUT up, DUT down and DUT forward using the same tester. Therefore, no expensive and time consuming modifications are necessary to accommodate different testing conditions. In addition, there is no yoke obstructing and limiting the movement of the test head. Moreover, by allowing for a full range of sag motion, the present invention allows for testing in situations where prior art testers cannot compensate for sag.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A manipulator having a frame and a cable connected to a test head for positioning said test head, said manipulator comprising:

a vertical and horizontal rail assembly mounted on said frame for maneuvering an expansion joint vertically and horizontally;

said expansion joint coupled to said vertical and horizontal rail assembly such that said expansion joint is movable between a fully extended position and a retracted position within said frame;

a swing arm having a first end, a second end and a longitudinal axis, said first end pivotally connected to said expansion joint allowing said swing arm to swing through degrees about a first axis; and a rotary bearing assembly connected to said test head and pivotally connected to said second end of said swing arm such that said rotary bearing assembly is pivotable about a second axis transverse to the longitudinal axis of said swing arm, said rotary bearing assembly allowing for the rotation of said test head about a third axis running through the center of said rotary bearing assembly, said rotation about said third axis allowing for twist motion of said test head provided said swing arm and said expansion joint are oriented with 0 degrees of swing and allowing for tumble motion of said test head provided said swing arm and said expansion joint are oriented with 90 degrees of swing.

2. The manipulator as described in claim 1 and further comprising a tumble assembly for pivotally coupling said swing arm to said rotary bearing assembly and wherein said tumble assembly allows tumble motion of said test head provided said swing arm and said expansion joint are oriented with 0 degrees of swing.

3. The manipulator as described in claim 1 wherein said cable extends longitudinally through said manipulator and having a length sufficient to accommodate full expansion of said expansion joint, said cable attached to said frame such that said cable forms a loop of slack within said frame when said expansion joint is not in said fully extended position.

4. The manipulator as described in claim 1 wherein said vertical and horizontal rail assembly comprises:

a vertical rail assembly coupled to said frame and for moving said expansion joint vertically; and a horizontal rail assembly coupled to said vertical rail assembly for moving said expansion joint horizontally.

5. The manipulator as described in claim 1 further comprising:

an electric motor coupled to provide automatic rotation of said test head about said center of said rotary bearing assembly at selectable first and second rates of rotation; and a manual adjustment coupled to provide manual rotation of said test head about said center of said rotary bearing assembly.

6. A manipulator including a frame and a cable connected to a test head comprising:
- a vertical rail assembly for moving said test head vertically;
- a horizontal rail assembly for moving said test head horizontally, said horizontal rail assembly coupled to said vertical rail assembly allowing said test head to be moved horizontally and vertically;
- an expansion joint connected to said horizontal rail assembly so as to provide expansion and retraction along a longitudinal axis, said expansion joint allowing for the extension of said manipulator from a fully retracted position to a fully extended position;
- a swing arm having a first end, a second end and a longitudinal axis, said first end of said swing arm pivotally coupled to said expansion joint allowing said swing arm to swing about a first axis; and
- a rotary bearing assembly connected to said test head and pivotally connected to said second end of said swing arm such that said rotary bearing assembly is pivotable about a second axis transverse to the longitudinal axis of said swing arm, said rotary bearing assembly allowing for the rotation of said test head about a third axis allowing for twist motion of said test head provided said swing arm and said expansion joint are oriented with 0 degrees of swing and allowing for tumble motion of said test head provided said swing arm and said expansion joint are oriented with 90 degrees of swing.

7. The manipulator of claim 6 wherein said cable extends longitudinally through said manipulator, said cable having a length sufficient to accommodate full extension of said expansion joint, said cable attached to said frame such that said cable forms a loop within said frame when said expansion joint is not in a fully extended position.

8. The manipulator of claim 7 wherein said vertical rail assembly further comprises:
- a plurality of rails coupled to said frame;
- a first plate; and
- a plurality of bearing assemblies coupled to said first plate, each of said bearing assemblies connected to one of said rails such that said first plate moves vertically.

9. The manipulator of claim 8 wherein said horizontal rail assembly further comprises:
- a plurality of horizontally located rails connected to said first plate;
- a second plate; and
- a plurality of horizontally located bearing assemblies connected to said second plate, each of said horizontally located bearing assemblies coupled to one of said horizontally located rails so as to connect said second plate to said first plate such that said second plate moves horizontally.

10. The manipulator of claim 9 wherein said first plate and said second plate have front surfaces and wherein said expansion joint further comprises:
- a cable housing connected to said swing arm;
- a first longitudinally located rail connected to said second plate and extending longitudinally along an axis perpendicular to the front surface of said first plate and perpendicular to the front surface of said second plate;
- a second longitudinally located rail connected to said second plate and extending longitudinally along an axis perpendicular to the front surface of said first plate and perpendicular to the front surface of said second plate;
- a longitudinally located bearing assembly coupled to said cable housing and coupled to said first longitudinally located rail; and
- a second longitudinally located bearing assembly connected to said cable housing and connected to said second longitudinally located rail such that said cable housing moves along said first longitudinally located rail and said second longitudinally located rail so as to extend and retract said cable housing so as to extend and retract said swing arm.

11. The manipulator of claim 10 wherein said cable housing includes an upper flange having an opening formed therein and a lower flange having an opening formed therein, said a swing arm further including an upper flange and a lower flange, said upper flange of said swing arm having an opening formed therein, said lower flange disposed below said upper flange of said swing arm and having an opening formed therein, said manipulator further comprising:
- a first pin disposed within said opening in said upper flange of said cable housing and within said opening in said upper flange of said swing arm so as to pivotally connect said cable housing to said swing arm; and
- a second pin disposed within said opening in said lower flange of said cable housing and within said opening in said lower flange of said swing arm so as to pivotally connect said cable housing to said swing arm, said first axis running through the center of said first pin and through the center of said second pin such that said swing arm is rotatable about said first axis.

12. The manipulator of claim 6 wherein said manipulator further comprises:
- a tumble assembly including a pivot pin and a tumble control screw, said second axis running through the center of said pivot pin, said pivot pin connecting said swing arm to said rotary bearing assembly such that said rotary bearing assembly rotates about said second axis, said tumble control screw connected to said swing arm and connected to said rotary bearing assembly, said tumble control screw operable to control the rotation of said rotary bearing assembly about said second axis so as to allow for tumble motion of said test head provided said swing arm and said expansion joint are oriented with 0 degrees of swing and allow for twist motion of said test head provided said swing arm and said expansion joint are oriented with 90 degrees of swing.

13. The manipulator of claim 12 wherein said tumble control screw has an attachment end coupled to said rotary bearing assembly, said manipulator further comprising:
- a gear box connected to said tumble control screw such that a distance exists between said gear box and the attachment end of said tumble control screw; and
- a screw handle connected to said gear box for operating said gear box so as to change the distance between said gear box and the attachment end of said tumble control screw, thereby allowing for the control of the rotation of said rotary bearing assembly about said second axis.

14. The manipulator of claim 13 wherein said test head further comprises a test head frame and wherein said rotary bearing assembly further comprises:
- a tumble plate having an opening formed therein, said first tumble flange and said second tumble flange attached to said tumble plate;
- a cylindrically shaped twist flange attached to said tumble plate such that said cable is disposed within said twist flange and such that said cable extends through said opening in said tumble plate;

a head flange attached to said test head frame, said head flange having a cylindrical shape including an outer cylindrical surface;

rotary bearings disposed around said outer cylindrical surface of said head flange; and a mounting flange connected to said twist flange, said mounting flange having a cylindrical shape, said mounting flange disposed around said rotary bearings such that said head flange is rotatable within said mounting flange.

15. The manipulator of claim 14 wherein said manipulator further comprises:

a twist control motor;

a shaft coupled to said twist control motor;

a sprocket connected to said shaft such that the rotation of said twist control motor rotates said sprocket; and a chain disposed around said head flange and disposed around said sprocket such that the rotation of said twist control motor rotates said head flange.

16. A tester for testing electronic devices comprising:

a frame;

a test head including test circuitry;

a cable connected to said test head for providing power and plumbing to said test head;

a manipulator connected to said frame and coupled to said test head for positioning said test head, said cable extending longitudinally through said manipulator, said manipulator comprising:

a vertical rail assembly for moving said test head vertically;

a horizontal rail assembly for moving said test head horizontally, said horizontal rail assembly connected to said vertical rail assembly allowing said test head to be moved horizontally and vertically;

an expansion joint connected to said horizontal rail assembly so as to allow for lateral extension and contraction of said manipulator;

a swing arm having a first end and a second end and a longitudinal axis, said first end of said swing arm pivotally connected to said expansion joint allowing said test head to swing about a first axis running through said pivot coupling; and a rotary bearing assembly pivotally connected to said second end of said swing arm such that said rotary bearing assembly is pivotable about a second axis transverse to the longitudinal axis of said swing arm, said rotary bearing assembly coupled to said test head such that said test head is rotatable about a third axis running along the center of said rotary bearing assembly.

17. The tester of claim 16 wherein said manipulator further comprises:

a tumble assembly including a pivot pin, said second axis running through the center of said pivot pin, said pivot pin coupled to said swing arm and coupled to said rotary bearing such that said rotary bearing assembly rotates about said second axis; and a tumble control screw coupled to said swing arm and coupled to said rotary bearing assembly, said tumble control screw operable to control the rotation of said rotary bearing assembly about said second axis.

18. The tester of claim 17 wherein said vertical rail assembly further comprises:

a plurality of rails coupled to said frame;

a first plate; and a plurality of bearing assemblies coupled to said first plate, each of said bearing assemblies connected to one of said rails such that said first plate moves vertically.

19. The manipulator of claim 18 wherein said horizontal rail assembly further comprises:

a plurality of horizontally located rails connected to said first plate;

a second plate; and a plurality of horizontally located bearing assemblies connected to said second plate, each of said horizontally located bearing assemblies coupled to one of said horizontally located rails so as to connect said second plate to said first plate such that said second plate moves horizontally.

20. The manipulator of claim 19 wherein said first plate and said second plate have front surfaces and wherein said expansion joint further comprises:

a cable housing connected to said swing arm;

a first longitudinally located rail connected to said second plate and extending longitudinally along an axis perpendicular to the front surface of said first plate and perpendicular to the front surface of said second plate;

a second longitudinally located rail connected to said second plate and extending longitudinally along an axis perpendicular to the front surface of said first plate and perpendicular to the front surface of said second plate;

a longitudinally located bearing assembly coupled to said cable housing and coupled to said first longitudinally located rail; and a second longitudinally located bearing assembly connected to said cable housing and connected to said second longitudinally located rail such that said cable housing moves along said first longitudinally located rail and said second longitudinally located rail so as to extend and retract said cable housing so as to extend and retract said swing arm.

* * * * *